（12） United States Patent
Hau

(10) Patent No.: US 11,444,603 B2
(45) Date of Patent: Sep. 13, 2022

(54) POWER CONTROL BY DIRECT DRIVE

(71) Applicant: King Kuen Hau, Hong Kong (CN)

(72) Inventor: King Kuen Hau, Hong Kong (CN)

( * ) Notice: Subject to any disclaimer, the term of this patent is extended or adjusted under 35 U.S.C. 154(b) by 0 days.

(21) Appl. No.: 16/888,853

(22) Filed: Jun. 1, 2020

(65) Prior Publication Data

US 2022/0029535 A1 Jan. 27, 2022

Related U.S. Application Data

(62) Division of application No. 16/081,932, filed as application No. PCT/IB2017/051799 on Mar. 29, 2017, now Pat. No. 10,715,116.

(Continued)

(51) Int. Cl.
*H03L 5/00* (2006.01)
*H03K 3/012* (2006.01)
*H02M 1/08* (2006.01)
*H02M 3/06* (2006.01)
*H03K 5/00* (2006.01)
*H03K 19/0175* (2006.01)
*H03H 5/12* (2006.01)
*G06G 7/163* (2006.01)
*H02M 7/06* (2006.01)
*H02M 1/00* (2006.01)
*H02M 1/34* (2007.01)

(52) U.S. Cl.
CPC ............. *H03K 3/012* (2013.01); *H02M 1/08* (2013.01); *H02M 3/06* (2013.01); *H03K 5/00006* (2013.01); *H03K 19/017509* (2013.01); *G06G 7/163* (2013.01); *H02M 1/0012* (2021.05); *H02M 1/0048* (2021.05); *H02M 1/342* (2021.05); *H02M 7/06* (2013.01); *H03H 5/12* (2013.01); *Y02B 70/10* (2013.01)

(58) Field of Classification Search
CPC .... H03H 11/245; H03H 11/24; H03K 17/693; H03G 1/0088; H03G 1/007
USPC .......................................................... 327/308
See application file for complete search history.

(56) References Cited

U.S. PATENT DOCUMENTS

2012/0280681 A1\* 11/2012 David ................ G01R 33/0029
324/251
2018/0063918 A1\* 3/2018 Nakamura ........... B60Q 1/0094

FOREIGN PATENT DOCUMENTS

WO WO-2014033694 A1 \* 3/2014 ............. H03H 11/28

\* cited by examiner

*Primary Examiner* — Quan Tra
*Assistant Examiner* — Anh-Quan Tra

(57) ABSTRACT

A power control circuit comprising a power supply and a load, the load being synthesized from an impedance synthesizer comprising two-terminal impedance elements connected in series and grouped in impedance modules. The impedance elements in each impedance module are of equal value, while those between the modules bear ratios uniquely defined according to the numbers of impedance elements in the impedance modules. A number of switches associated with said impedance elements short out a selected number of the impedance elements under the control of a first analog signal which may be preprocessed by an analytic function. The analog signal is converted to digital signals by an analog-to-digital converter, then level shifted to control the switches associated with the impedance elements, whereby the amount of power delivered to the load is controllable by the first analog signal. Pulse-width-modulation is deployed to further control the power by a second analog signal, with additional benefit of overload protection.

24 Claims, 16 Drawing Sheets

Related U.S. Application Data

(60) Provisional application No. 62/452,900, filed on Jan. 31, 2017, provisional application No. 62/423,763, filed on Nov. 17, 2016, provisional application No. 62/316,740, filed on Apr. 1, 2016.

POWER CONTROL BY DIRECT DRIVE

CROSS REFERENCE TO RELATED APPLICATIONS

This is a divisional application of U.S. application Ser. No. 16/081,932, filed on Mar. 29, 2017, now allowed. The prior application Ser. No. 16/081,932 claims priority to U.S. Provisional Application No. 62/316,740, filed on Apr. 1, 2016, U.S. Provisional Application No. 62/423,763, filed on Nov. 17, 2016, and U.S. Provisional Application No. 62/452,900, filed on Jan. 31, 2017;

The contents of each of the above-mentioned patent applications are expressly incorporated herein by reference.

BACKGROUND OF THE INVENTION

Field of Invention

The present invention relates generally to apparatus and methods for power control, and particularly to power control by Direct Drive.

Description of the Related Art

When electrical power, in terms of voltage or current, is applied to a load, there are basically a number of issues critical for effective transfer of energy from the power supply to the load.

First, the voltage or current level from the power supply should be appropriate for the load, as a load is usually designed to work properly only within a certain range of voltage or current level. Second, the load may have been specified to accept a certain characteristics of the supply voltage, say DC or AC, at certain frequency, and with certain waveforms. Third, the output impedance of the power supply should be able to cope with all the load to be connected by design. Not meeting any of the specified requirements may give rise to compromised operation performance or even destructive damage to the power supply and/or the load.

Over the decades large number of various electrical and electronic systems and methods have been developed to address the above issues. These include power transformers to raise or lower AC voltage levels, DC-to-DC converters or AC-to-DC converters to provide DC voltage supplies, and DC-to-AC or AC-to-AC converters to provide AC voltage supplies, with or without frequency changes, etc. for wide varieties of loads.

However, there is also a class of electrical appliances or electronic devices which do not need the above conversion processes by transformers or converters or the like for normal operation. Call it by Direct Drive, such appliances or devices are connected directly, without galvanic isolation and without any change of the characteristics of the supply voltage, to the electrical supplies. When polarity matters, a rectifier may be employed to provide a DC supply from an AC supply without breaking the galvanic connection. Apart from the switches to pass through, electromotive force from the supply is impressed directly on the load and current flows directly from the power supply to the load. In other words, we define Direct Drive as one that the load and the power supply are in galvanic connection through switches (including rectifiers which may be viewed as switches) but no other devices that might alter the characteristics of the power supply.

An obvious benefit from direct drive is the elimination of power losses in facilitating galvanic isolation if otherwise required, such as that by a transformer, and/or a converter, a switch-mode AC-to-DC converter commonly deployed for example. The only power loss is in the switches, which could be rather low especially when the switching frequency is not high. This implies high overall energy efficiency. Further, system cost is reduced as the requirement of parts is much reduced when there is no requirement for galvanic isolation, none for voltage scaling, none for waveform or frequency conversion, etc. Very often, the need of reactive parts in association with power switching is also reduced. This implies a lower chance of electromagnetic interference generation. Consequently, we may say that direct drive implies high efficiency, low cost and EMI free in general.

However, there is potentially a risk in direct drive when the stability of the power supply voltage is uncertain. This is often the case when the supply is from the utility grid. Any excessive fluctuation, even for a short period, in the supply voltage may place the load in the risk of being damaged or rendered inoperative. The problem may be further amplified when the load is nonlinear, solid state light employing light emitting diodes as an example. It is well known that for such kinds of devices a small change in supply voltage will lead to a large change of load current, possibly to an extend that the load and/or the power supply will be damaged.

Therefore, for both functional requirement and system protection, the method to control the power delivered to the load by direct drive is crucial. By the very basic principle of electricity, power delivered to a load is proportional to the square of the voltage applied to the load divided by the impedance of the load; alternatively, it is proportional to the square of the load current times the impedance of the load. Hence the total amount of power delivered to the load by direct drive may be controlled by controlling the impedance of the load, and/or by controlling the duty cycle the load current is passed, both by the action of switches.

To control the impedance of the load, an effective method has been invented as the voltage controlled impedance synthesizer, VCZS in abbreviation, as described by U.S. Pat. No. 9,543,925 of which this application is a continuation-in-part. However, since the synthesis is through switching, the fineness of impedance control will be dependent on the number of switches deployed. Hence to achieve a desired level of fineness, the number of switches needed may be excessive and practically unacceptable.

Further, to implement the controlled impedance in power applications, high voltage level floated switching is deemed necessary, so is dynamic high voltage level shifting for driving the floating switches. Furthermore, due to the interaction between the switches, not to mention the direct exposure to the generally noisy supply line, very high dV/dt noise pulses will be present. This means a big challenge for the design of the relevant control circuits which do not seem to exist in the prior art.

Further still, at the risk of excessive excursion of the supply voltage or the load current, protective measures for both the load and the power supply would need to be developed.

It is therefore an objective of the present invention to develop cost-effective ways of Power Control by Direct Drive, such that efficient and reliable operation of the load device is achieved despite of the challenges identified above.

BRIEF DESCRIPTION OF THE DRAWINGS

With the foregoing in view, as other advantages as will become apparent to those skilled in the art to which this invention relates as this patent specification proceeds, the invention is herein described by reference to the accompanying drawings forming a part hereof, which includes descriptions of some typical preferred embodiments of the principles of the present invention, in which.

DETAILED DESCRIPTION OF THE INVENTION

Figure 1:
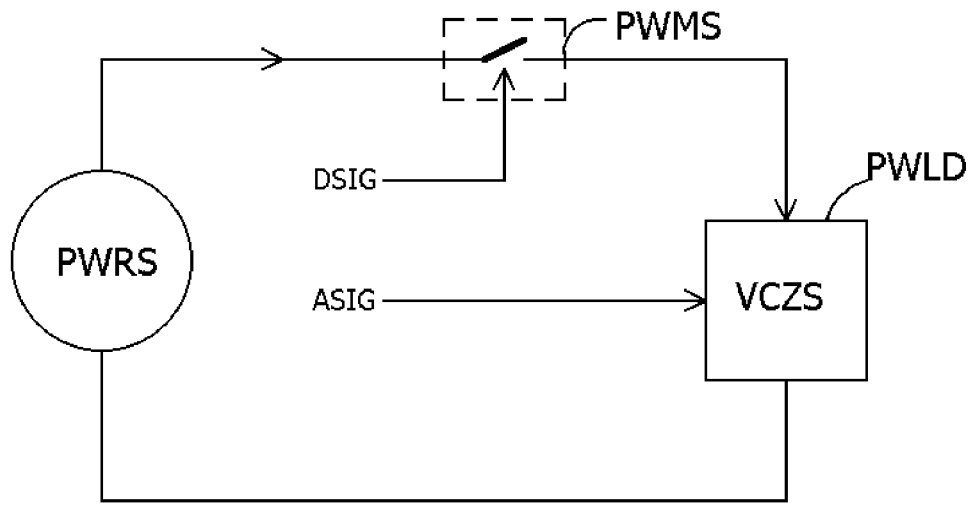
FIG. 1 Block diagram showing the principle of power control by direct drive

The basic principle of the present invention can be illustrated by the block diagram of FIG. 1. As shown, the power supply PWRS is supplying power to a power load PWLD, which is a load with a fixed impedance in general but may also be a load with controllable impedance, and which can be achieved by a voltage controlled impedance synthesizer VCZS, as described by U.S. Pat. No. 9,543,925 of which this application is a continuation-in-part. As will be explained in the following, impedance synthesis is one of the ways power can be controlled in direct drive systems. Between the power supply and the load, a pulse-width-modulation switch PWMS is proposed to be inserted to "chop" the current passing the load. In some of the embodiments of the present invention, as shown in FIG. 1, the voltage controlled impedance synthesizer can be controlled by an analog signal ASIG while the pulse-width-modulation switch is controlled by a digital signal DSIG.

The impedance synthesizer basically provides stepwise monotonically variable impedance values according to a prescribed function of a control voltage as described by U.S. Pat. No. 9,543,925. Said synthesizer comprises a number of at least one two-terminal impedance modules connected in series; between the two terminals of each impedance module a number of at least one two-terminal impedance elements connected in series; wherein all the impedance elements in each impedance module are essentially of the same impedance value; the impedance values of the impedance elements between the impedance modules bear ratios $Z_1:Z_2:Z_3: \ldots Z_m: \ldots$ in the order of increasing value, $Z_1:Z_m=1:\Pi(N_i+1)$ where i=1 to m−1, $Z_m$ is the impedance value of each impedance element of the $m^{th}$ impedance module, $N_i$ is the total number of impedance elements in the $i^{th}$ impedance module, and $\Pi$ is a mathematical multiplication operator; and a control means to short out a prescribed number of the impedance elements by a plurality of switches according to an analog control voltage.

Figure 2:
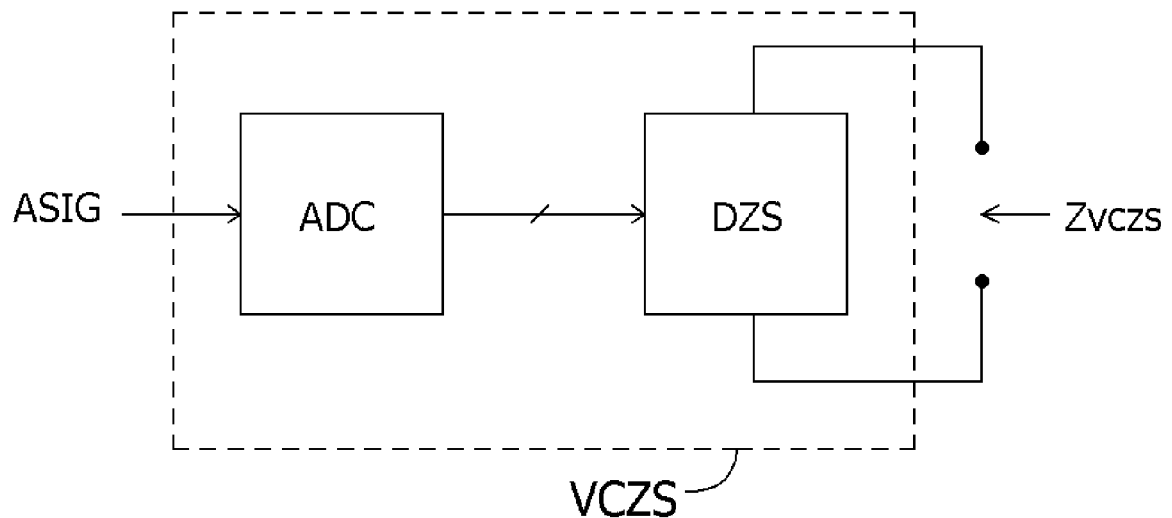
FIG. 2 Block diagram showing a voltage controlled impedance synthesizer
Figure 3:
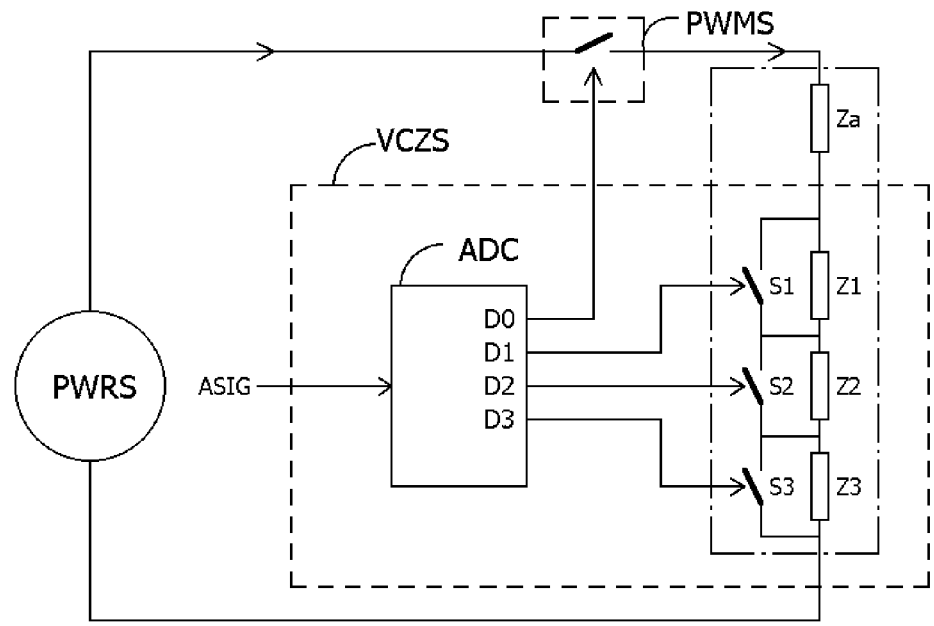
FIG. 3 Block diagram showing how a voltage controlled impedance synthesizer is deployed for power control by direct drive FIG. 4 Block diagram as FIG. 3 with level shifter FIG. 5 Block diagram showing the principle of power control by direct drive FIG. 6A Block diagram of a power control system by impedance/admittance synthesis FIG. 6B Block diagram of a power control system by impedance/admittance synthesis FIG. 7A Block diagram showing a power control system for constant load current FIG. 7B Block diagram showing a power control system for constant load voltage FIG. 7C Block diagram showing a power control system for constant load current FIG. 8 Block diagram showing a power control system for constant power FIG. 9 Block diagram showing a square function for power control FIG. 10 Block diagram showing another square function for power control FIG. 11 Block diagram showing a multiplication function FIG. 12 Block diagram showing a division function FIG. 13A Block diagram showing pulse-width-modulation control of current FIG. 13B Block diagram showing pulse-width-modulation control of current FIG. 14 Graph of current control curve by pulse-width-modulation FIG. 15 Block diagram showing pulse-width-modulation control of voltage FIG. 16 Circuit of a level shifter FIG. 17 Circuit implementation of a level shifter FIG. 18 Waveform with reference to FIG. 17

FIG. 2 is a block diagram showing the basic operation principle of one of the operation mode of the impedance synthesizer. As shown, an impedance $Z_{VCZS}$ is generated under the analog control signal ASIG, say for an impedance value proportional to the magnitude of ASIG by design. The control signal is converted by an analog-to-digital converter ADC to a multi-bit digital signal, which then controls the on and off of the switches inside the digital impedance synthesizer DZS to obtain the impedance $Z_{VCZS}$, as revealed by an exemplary circuit of FIG. 3. The circuit shows a voltage controlled impedance synthesizer VCZS which comprises an analog-to-digital converter ADC with binary digital outputs D0, D1, D2 and D3. The binary format of the digital output is required to drive the impedance modules shown, one of many possible design configurations possible according to U.S. Pat. No. 9,543,925, each with a single impedance element Z1, Z2 and Z3 in binary ratios, i.e. in the ratio 4 to 2 to 1. The most significant digit D0 is coupled to switch the chopper or PWM switch PWMS while the least significant digit D3 is coupled to switch Z3 which is of the lowest impedance value among the three impedance elements Z1, Z2 and Z3. Total load impedance as presented to the power supply is therefore Za when all four switches are closed, to infinity when all switches are open. Note that until later discussion, pulse-width-modulation is not designed in as the switch is simply activated by a binary signal D0. When ASIG exceeds a certain value, the switch PWMS serves by design to be turned off by D0 as a protection means. However to achieve fine control through PWM, an independent control of the switch will be required and will be introduced in later discussion.

Figure 4:
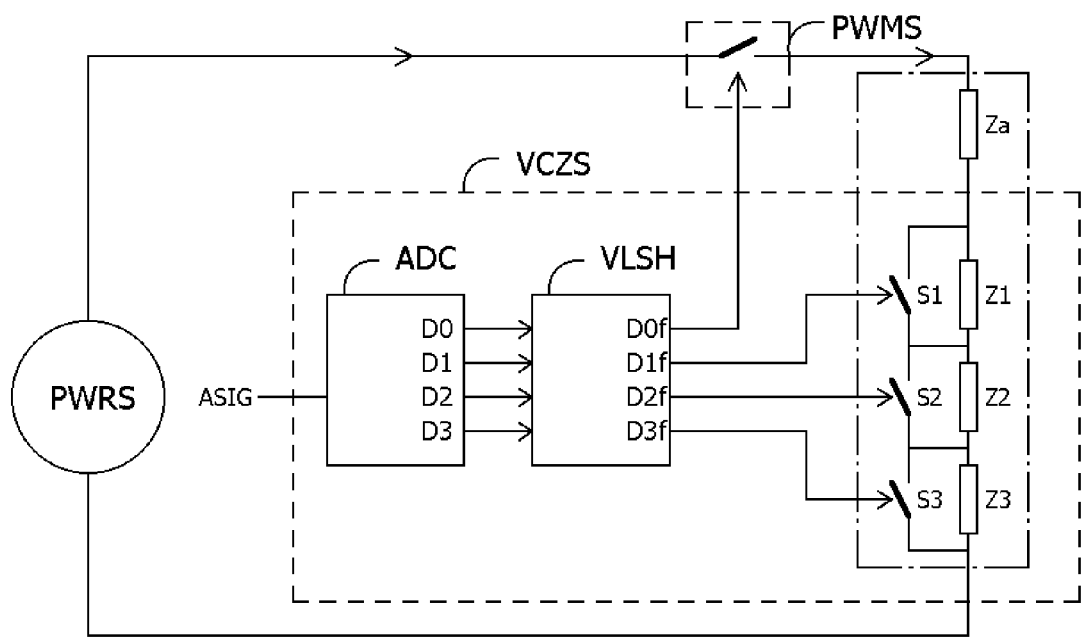

Note also that the switches are floating, i.e. they are each operated at a voltage level dependent on the status of other switches and the power supply voltage. Consequently the output from the converter ADC might not be able to cope with these different and usually high voltage levels, say in tens or even hundreds of volts. Dynamic level shifters are therefore required as shown in FIG. 4. The digital outputs D0 to D3 from ADC are level shifted to corresponding digital outputs D0f to D3f from the level shifter VLSH, each to a voltage level of the corresponding switch being driven.

For loads which accept wave-form-distorted current, such as some lighting or heating devices, the time the load is connected to the power supply may be controlled through phase-cut. Further the phase-cut may be carried out at a frequency substantially higher than the supply frequency, operation of which is then normally called pulse-width-modulation, synchronized or not to the power supply voltage. For the present invention, the PWM refers generally to phase-cut at any frequency, including frequencies substantially higher than the supply frequency, and synchronization to the supply is not essential.

By PWM the duty cycle of power applied to the load can be finely controlled, which is not generally achievable by impedance synthesis alone. Therefore, in combination with the voltage controlled impedance synthesizer, the phase-cut or pulse-width-modulation approach is deployed for the following objectives of the present invention:
1 Limiting the power delivered to the load at high input voltage;
2 Over-voltage protection;
3 Over-current protection;
4 Over-temperature protection;
5 Improving the power factor for non-linear loads.
6 Reduction of instantaneous power at the peak of the supply voltage evens out the fluctuation of the output of the load, which is in general desirable in the case of lighting, for example. This means that flickering of the light output would thus be reduced.

Figure 5:
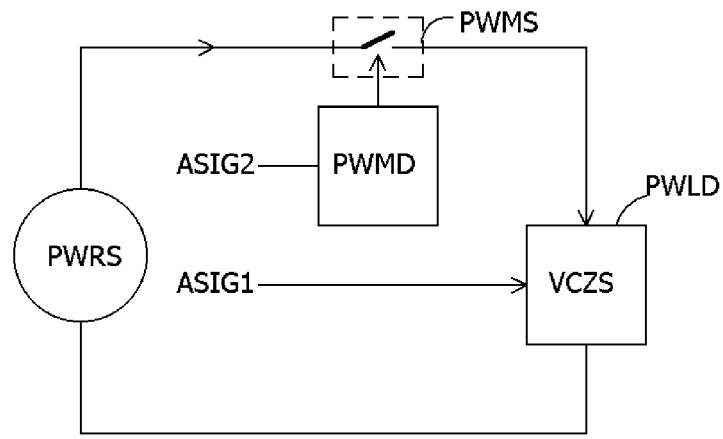

A simple block diagram of FIG. 5 shows such combination. The power load PWLD as synthesized by VCZS is controlled by analog signal ASIG1. The PWM switch PWMS is controlled by analog signal ASIG2 through a pulse-width-modulation driver PWMD.

For ease of discussion, we shall examine for the time being power control by impedance/admittance synthesis only, leaving the pulse-width-modulation for later discussion.

Figure 6A:
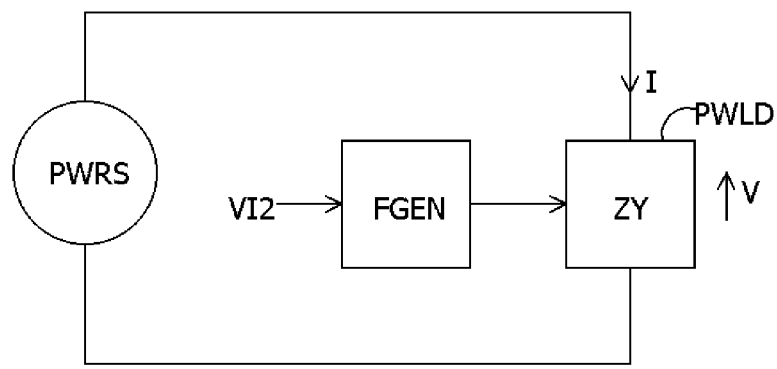
Figure 6B:
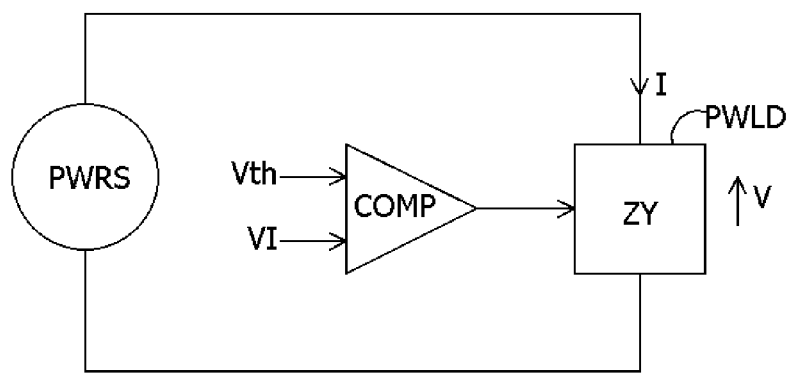

Power control through the use of synthesized impedance/admittance can be categorized into two different circuit configurations, as illustrated by the block diagrams of FIG. 6A and FIG. 6B respectively. Note for FIG. 6A, the impedance/admittance is controlled by a single control signal VI which is processed by a function generator FGEN. For FIG. 6B, the impedance/admittance is controlled also by a control signal VI but with an additional signal of predetermined threshold Vth. This threshold facilitates easy setting of the control targets of the power control system.

Referring to FIG. 6A, the power supply PWRS is providing a supply voltage V (hence load voltage) or a supply current I (hence load current) to the load PWLD which has an impedance or admittance ZY, which is synthesized according to a voltage or current signal VI processed by a function generator FGEN. A function generator is hereby defined as a signal processing device with an input and an output, whereby the output is a real analytic function of the input. The function as needed, for example, can be a scaling constant, a square, or a square-root of input signal VI. The signal VI can be a constant (a fixed DC) or a time-varying signal, either an external signal or one from the power circuit, such as the load voltage or current as provided by the power supply or those under control.

Referring to FIG. 6B, the power supply PWRS is providing a supply voltage V or a supply current I to the load PWLD which has an impedance or admittance ZY, which is synthesized according to the difference of a voltage or current signal VI from a predetermined threshold Vth. The difference is obtained by comparing the signal VI to the threshold Vth by the comparator COMP. The signal VI just as that in FIG. 6A can be a constant (a fixed DC) or a time-varying signal, either an external signal or one from the power circuit, such as the load voltage or current as provided by the power supply or those under control. By feedback control the impedance/admittance ZY can be driven to change in a direction so as to minimize the difference, i.e. making VI close to Vth. As an example of application, if VI is representative of the load current, the load current is then controlled to approach a value as set by Vth.

Illustrative circuit examples are to be examined, with reference to the circuit configuration of FIG. 6A first.

For the case when the function of FGEN be a scaling constant K, the various equations derived therefrom relating the load voltage V and load current I are summarized in Table 1. Note that for impedance/admittance modules powered by either a voltage or a current supply, as the impedance/admittance value is controlled by either the load voltage or the load current, there are four combinations of voltage-current relationships. Voltage and current are related by a constant, a square-root, or a square function. There is also one which is in-determinant, meaning that no real function can be established.

TABLE 1

| Module control signal | Module powered by | | | |
|---|---|---|---|---|
| | V on modules of | | I on modules of | |
| | Z1 | Y1 | Z1 | Y1 |
| V | I = 1/K | I = K·V$^2$ | (in-determinant) | V = (I/K)$^{1/2}$ |
| I | I = (V/K)$^{1/2}$ | (in-determinant) | V = K·I$^2$ | V = 1/K |

Note the duality property of the circuit topology. The roles of V and I, Z and Y are interchangeable for each of the same mathematical relationships. Also, note that the square and the square-root functions established between V and I might be deployed for power control or signal processing in general. Further explanation will be provided through examples.

As in some exemplary embodiments of the present invention, load current is controlled constant irrespective of the supply voltage, by setting the impedance of the power load PWLD be proportional to the load voltage V1. As shown by the block diagram of FIG. 7A, where the function of the function generator is labelled K·x, x being the input and K being a constant characteristic of the function generator FGEN by design, and K is also dependent on the design of Z1: (Note detector of V1 omitted in the block diagram for simplicity)

$$Z1 = K \cdot V1$$

$$I1 = V1/Z1 = V1/(K \cdot V1) = 1/K \text{ which is a constant.}$$

Figure 7A:
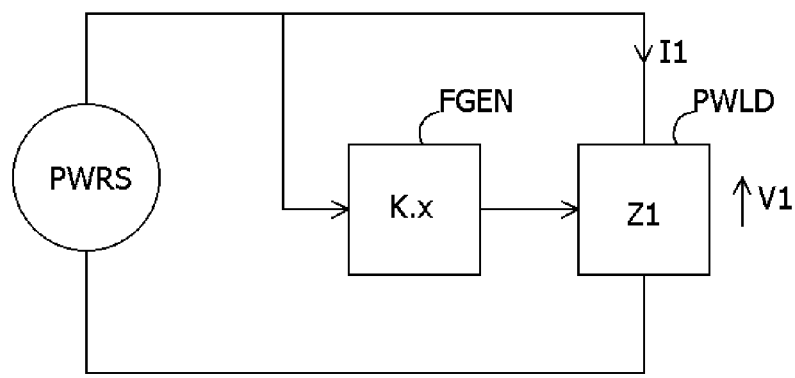
Figure 7B:
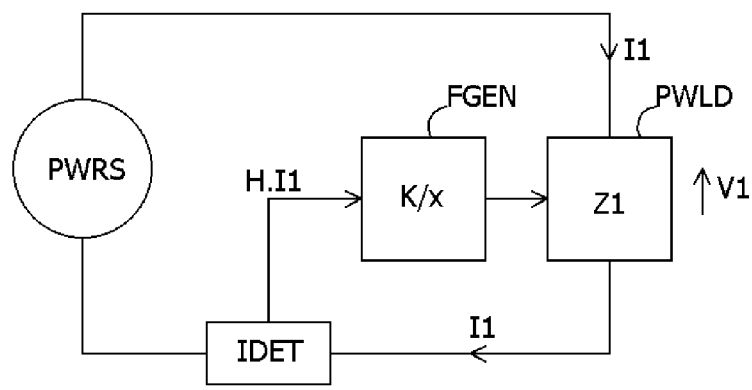

For yet some other embodiments of the present invention when the power supply is a current source and it is desirable to maintain a constant voltage across the load irrespective of the supply current, the circuit configuration of FIG. 7B may be deployed. As shown, a multiplicative inverse function K/x is deployed for the function generator FGEN:

$$Z1 = K/(H \cdot I1) \; H \text{ being a constant characteristic of the current detector IDET by design}$$

$$V1 = I1 \cdot Z1 = I1 \cdot K/(H \cdot I1) = K/H \text{ which is constant.}$$

Figure 12:
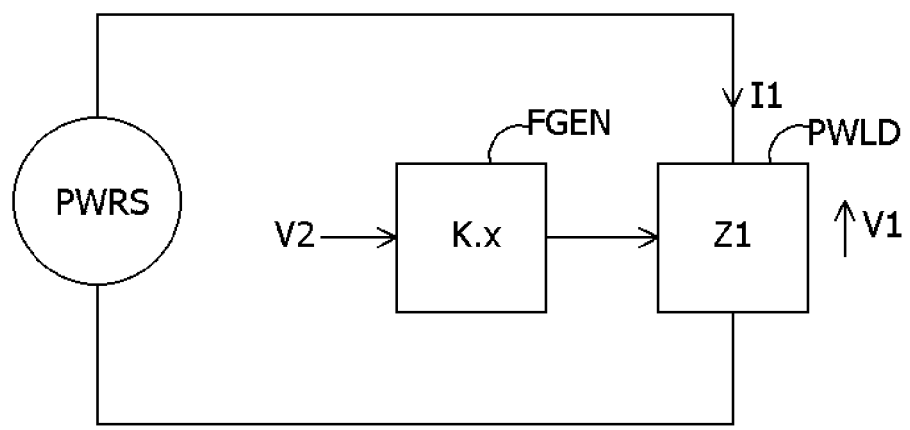

The multiplicative inverse function may be implemented by a circuit as shown in FIG. 12, to be discussed later.

Figure 8:
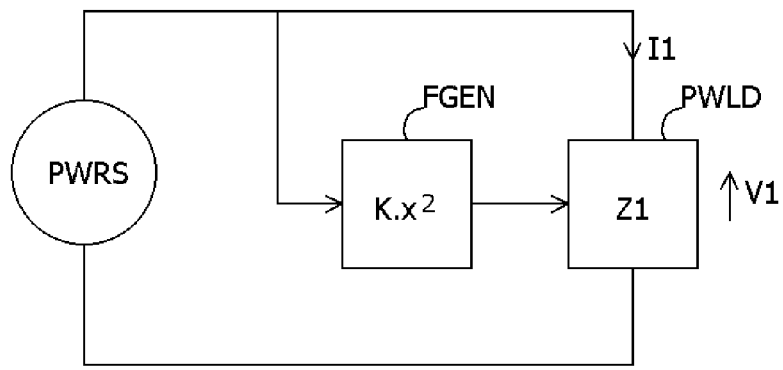

By the use of voltage controlled impedance/admittance, the delivery of constant power from a voltage power supply, irrespective of the magnitude of the supply voltage, is now described with reference to FIG. 8. As shown, Z1 is impedance of the power load PWLD, which is formed by a voltage controlled impedance synthesizer VCZS. Now Z1 is synthesized under the control of V1, through a function generator FGEN of a square function $K \cdot x^2$, i.e.

$$Z1 = K \cdot V1^2,$$

Power P on the load PWLD is therefore:

$$P = V1^2/Z1 = V1^2/(K \cdot V1^2) = 1/K \text{ which is constant.}$$

Figure 9:
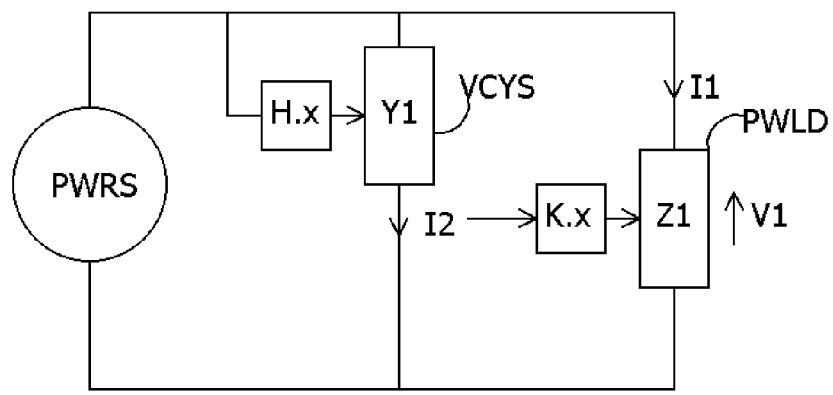

The square function $K \cdot x^2$ can be implemented by synthesized impedance or admittance as listed in Table 1. As shown in FIG. 9, Y1 is the admittance formed by a voltage controlled admittance synthesizer VCYS. Y1 will generate a current.

Remark: By the duality property of electrical circuits the operation of a voltage controlled admittance synthesizer VCYS can be derived easily from that of a voltage controlled impedance synthesizer VCZS. In general, the synthesis of the admittance value comprises the steps of connecting one or more two-terminal admittance modules in parallel; connecting one or more two-terminal admittance elements of equal admittance value in parallel in each admittance module; wherein the admittance elements in all the admittance modules are of equal quality factor; wherein the admittance values bear ratios $Y_1:Y_2:Y_3: \ldots Y_m: \ldots$ in order of increasing value, $Y_1:Y_m=1: \Pi(N_i+1)$ where i=1 to m−1, $Y_m$ is the admittance value of each admittance element of a $m^{th}$ admittance module, $N_i$ is the total number of the admittance elements in an $i^{th}$ admittance module, and Π is a mathematical multiplication operator; converting an analog voltage to a plurality of digital signals; and by the plurality of digital signals controlling a number of controllable switches associated with said admittance elements to open circuit a number of the admittance elements; whereby the admittance value is controlled by the analog voltage.

Note Y1 is controlled by V1 scaled by a constant H, while Z1 is controlled by I2 scaled by a constant K. Driven by V1 the VCYS delivers I2 which is proportional to the square of V1.

(Note detector of I2 omitted in the block diagram for simplicity)

$$Z1 = I2 \cdot K$$

$$Y1 = V1 \cdot H$$

$$I2 = V1 \cdot Y1$$

Power P of the load PWLD is therefore:

$$P = V1 \cdot I1 = V1 \cdot V1/Z1 = V1^2/K \cdot I2 = V1^2/(K \cdot V1 \cdot Y1) = V1^2/(K \cdot V1 \cdot V1 \cdot H) = 1/(H \cdot K)$$

i.e. $P = 1/(H \cdot K)$ which is a constant.

Note that Y1 has the role of signal processing only and therefore in practice minimum power dissipation is designed in.

Figure 10:
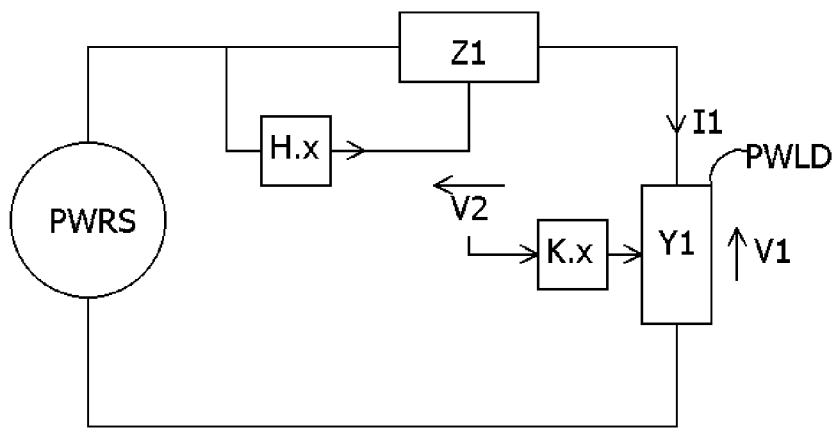

By the duality property of electrical circuits, a current power supply may be similarly controlled for delivery of constant power. Also by the duality property, a square function can be implemented by the use of a voltage controlled impedance synthesis. This can be demonstrated by the circuit configuration of FIG. 10. The current supply is delivering a current I1. It can be verified that voltage V2 across the impedance Z1 is proportional to square of I1, and power delivered to the load PWLD is $1/(H \cdot K)$ which is a constant.

Figure 11:
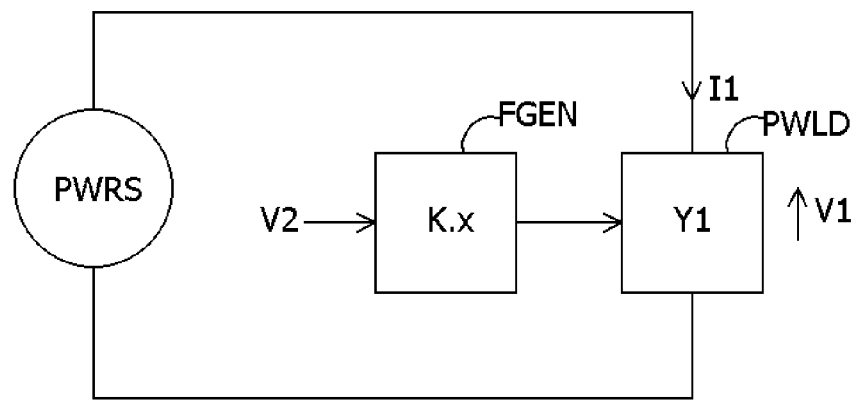

In general if an external sign V2 is apply to control an admittance synthesizer powered by voltage V1, as illustrated by the block diagram of FIG. 11, a multiplication function of V1 and V2 can be achieved. As shown, $$I1 = V1 \cdot Y1$$

$$Y1 = K \cdot V2, \text{ leading to}$$

$$I1 = K \cdot V1 \cdot V2, \text{ i.e. } I1 \text{ as a function of the product of } V1 \text{ and } V2.$$

Note that in the special case of V1 held constant, I1 is directly proportional to V2.

Similarly, a division function is achieved by the use of voltage controlled impedance synthesis, as illustrated by the block diagram of FIG. 12:

$$I1 = V1/Z1$$

$$Z1 = K \cdot V2$$

$$I1 = (V1/V2)/K, \text{ i.e. } I1 \text{ as a function of the quotient of } V1 \text{ by } V2.$$

Note that in the special case of V1 held constant, so that I1=H/V2 which has a relationship of multiplicative inverse function, i.e. I1 is inversely proportional to V2.

The above is discussed with V1 as a voltage power supply driving the admittance or impedance. By the duality property of electrical circuit, functions of multiplication and division could also be implemented by the use of a current supply I1 driving a synthesized admittance/impedance. The derived equations are summarized in Table 2.

TABLE 2

| Module control signal | Module powered by | | | | |
|---|---|---|---|---|---|
| | V1 on modules of | | | I1 on modules of | |
| | Z1 | Y1 | | Z1 | Y1 |
| V2 | I = (V1/V2)/K | I = K.V1.V2 | I2 | V = K.I1.I2 | V = (I1/I2)/K |

Again note the duality property of the circuit topology. The roles of V and I, Z and Y are interchangeable for each of the same mathematical relationships.

Let us now examine some illustrative circuit examples for the circuit configuration of FIG. 6B. While FIG. 7A shows an example of constant current control, FIG. 7C is performs the same function of constant current but implemented according to circuit configuration of FIG. 6B instead.

As shown, the load current I1 is measured by the current detector IDET with an output signal VI representative of the current I1. VI is compared to a predetermined threshold Vth by a comparator COMP. When VI is low, the output of COMP is low and the impedance of Z1 is low. However, when the load current increases, say due to an increase in the supply voltage and hence the load voltage V1, VI will eventually exceeds Vth that the output of COMP goes up. This leads to an increase in the load impedance Z1 such that the load current is reduced. It is therefore seen that a negative feedback loop is formed and as long as there is sufficient loop gain the load current I1 is held constant despite of changes in the power supply voltage.

Figure 7C:
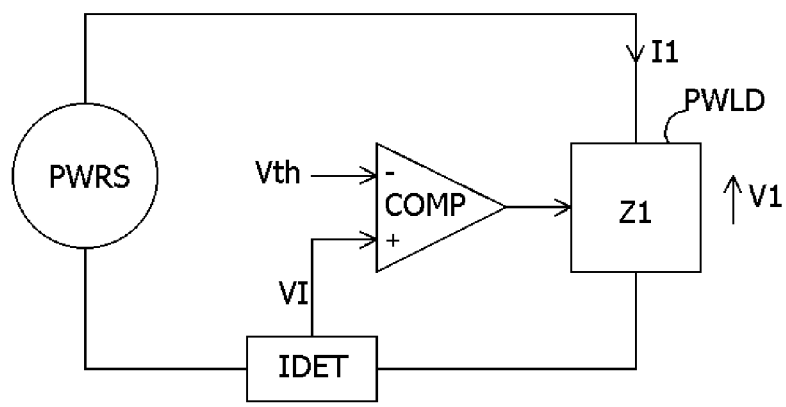

Similarly if the power on the load impedance Z1 is measured as VI instead, a circuit similar to that of FIG. 7C may be deployed to provide constant load power.

After the discussion on power control through the control of load impedance or admittance, let us examine a different approach of power control by direct drive, namely the pulse-width-modulation.

Figure 13A:
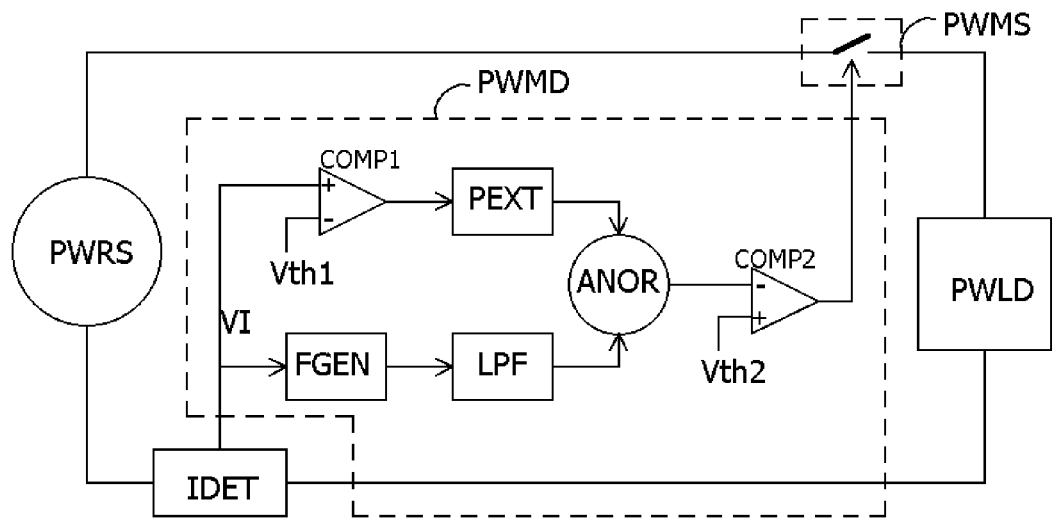

As already mentioned with reference to FIG. 5, the role of the pulse-width-modulation driver PWMD is to generate a switch driving signal with a duty-cycle controlled by an analog signal ASIG2. For ease of discussion, we shall assume the load as one of fixed impedance for the time being, i.e., the control signal ASIG1 of the impedance synthesizer VCZS being a constant voltage. Dependent on the design purpose, ASIG2 may be a signal representative of a voltage or a current that needs to be monitored and/or controlled. As an exemplary embodiment of the present invention, FIG. 13A shows the block diagram of a pulse-width-modulation driver in a system by which both functions, load current regulation and over-current protection, are achieved by pulse-width-modulation.

As shown, power is delivered from the power supply PWRS to the load PWLD via a PWM switch PWMS. Load current is detected by a detector IDET with an output signal VI. The PWMS chops the load current under the control of the driver PWMD, according to the magnitude of VI which represents the level of load current. Signal VI is processed via two paths. One path is through a function generator FGEN and a low-pass-filter LPF. The signal VI is preprocessed by a predetermined function by the function generator, such as a scaling constant, a square or a logarithmic function for example, or whatever function required by design. Then it is averaged by a low pass filter LPF, generating an average or quasi-DC value of the preprocessed signal of VI.

The other path is through a comparator COMP1 which reacts only when the peak voltage of VI exceeds a predetermined threshold Vth1, raising the output of COMP1 high immediately. The rising edge of the output of COMP1 is coupled to trigger a pulse extender PEXT, which generates a pulse of a preset width. The pulse extender may be implemented by an edge-triggered mono-stable vibrator, or simply by quickly charging but slowly discharging a capacitor, for example.

The signals from the low pass filter LPF and the pulse extender are combined by an analog-OR circuit ANOR output of which is compared with a second predetermined threshold Vth2 by comparator COMP2. Should the signal level thus combined exceeds Vth2, the output of comparator COMP2 will turn low, switching off the switch PWMS.

For normal operation when over-current condition is not reached, the output of COMP1 is low as Vth1 is set by design high enough that it is not exceeded by VI. Output of COMP1 is low in a standby mode.

When load current is low, so is VI that the output from LPF is lower than Vth2, the output of COMP2 is high keeping the switch PWMS continuously on.

As the load current is raised and so is VI, the output from LPF will reach a value exceeding Vth2 such that the output of COMP2 goes low, turning off immediately the switch PWMS. Load current drops to zero, so is VI. However, due to the delaying effect of the low pass filter, it takes a while for the output voltage of LPF to go down, so that the switch PWMS will remain off for a while until the output voltage falls below Vth2, when the switch PWMS is turned on again. As the threshold Vth2 is exceeded again, the switch PWMS is turned off again after a while. Relaxation oscillation is thus established, turning the switch PWMS on and off. As long as the supply voltage from PWRS and the load impedance remain unchanged, the oscillation will stabilize to a point that the output of LPF is close to Vth2. It can be seen that the load current is in the form of current pulses, and the larger the load current pulse height, the lower the duty cycle of modulation of the switch PWMS. The circuit is then in a current-limiting mode with the load current maintained at a constant average value determined by Vth2.

When load current goes up abnormally, such as when the load is short-circuited, or when the supply voltage swings up high, VI goes up high but the LPF by its circuit characteristics will not be able to respond quickly to turn off the switch PWMS. It is the time when the peak detecting COMP1 comes into play. As VI exceeds Vth1, the output of COMP1 goes up immediately, triggering the pulse extender PEXT. Then output of the analog-OR circuit ANOR goes high, output of the comparator COMP2 goes low, turning off PWMS immediately for an extended period set by the pulse extender PEXT. In effect, the on time of the switch PWMS is very short but the off time is long, i.e. the duty cycle of switching is very low and therefore the average load current is also very low despite that the peak current is very high, thus ensuring that both the load and the supply source are protected from excessive power dissipation.

Figure 13B:
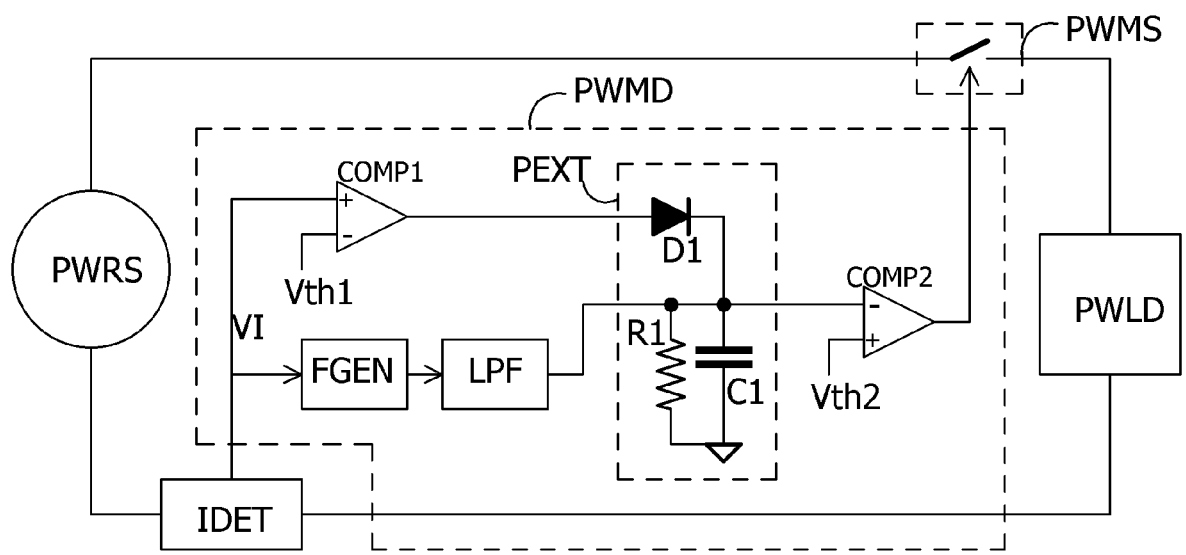

In some of the embodiments of the present invention, a practical design of the pulse extender is illustrated in FIG. 13B. As shown, the pulse extender is implemented by a diode D1, a capacitor C1 and a resistor R1. When the current signal VI exceeds the threshold Vth1, output of the first comparator COMP1 rises up to a high voltage and charges up C1 quickly through the diode D1. The diode acts as a rectified charger, meaning that the capacitor will not discharge back to the output of the comparator COMP1 when its output goes low.

Once charged up, the high voltage on C1 turns down the output of the comparator COMP2, shutting off the switch PWMS. Current signal VI goes zero immediately, bringing down the output of the comparator COMP1. However, this has no effect on the capacitor voltage in the presence of the diode D1, which is now reverse biased. Instead, the capacitor discharges through the resistor R1 for a period of time until the voltage on the capacitor goes below that of the second threshold Vth2 when the output of comparator COMP2 goes up and turning on the switch PWMS again. By proper selection of the values of C1 and R1, a predetermined time period for shutting off the switch PWMS, i.e. the preset pulse width of the pulse extender PEXT, is achieved.

Note that by the use of the diode D1, the outputs from the comparator COMP1 and the low pass filter LPF are effectively coupled together with an analog-OR function. Therefore, when VI is low and before the first threshold Vth1 is exceeded, the output of LPF takes full effect in the control loop of pulse-width-modulation of the load current.

Note also that in practice, the capacitor C1 and the resistor R1 could be designed into the low pass filter LPF. In fact, they may effectively be the Thevenin equivalent capacitance and resistance at the output of the low pass filter LPF.

Figure 14:
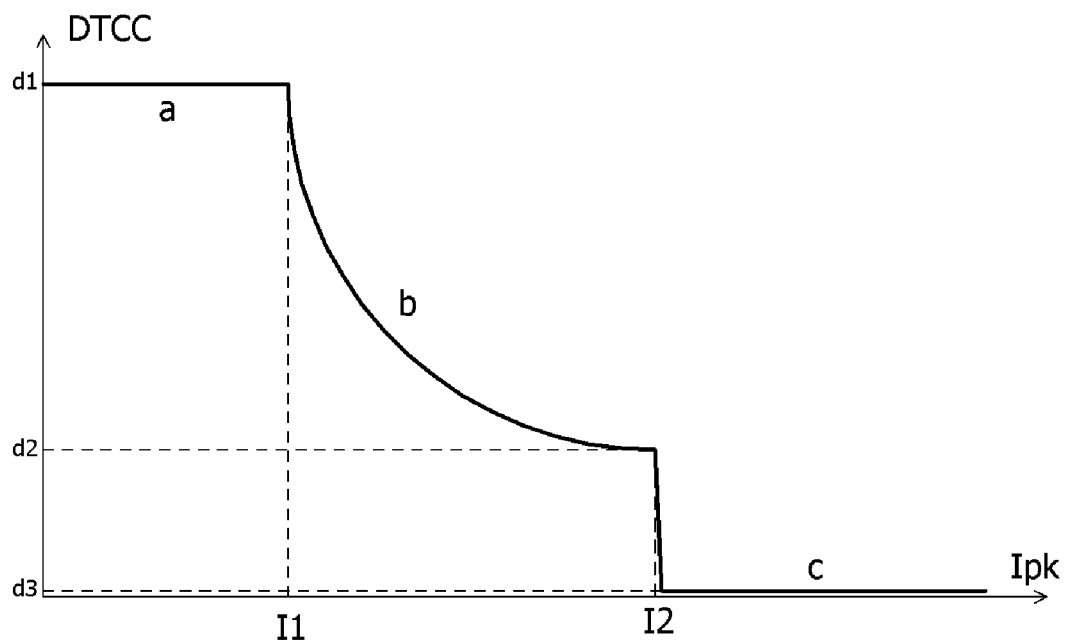

The performance of this current control and over-current protection scheme may be further illustrated by the graph of FIG. 14. The X-axis is the peak magnitude of load current Ipk while the Y-axis is the switching duty cycle DTCC of the switch PWMS. At low peak load current, the duty cycle of the switch PWMS is set to d1=100%, i.e. PWMS is continuously on along curve a. As load current is raised to I1, a value predetermined by the threshold Vth2, relaxation oscillation starts and DTCC goes down as peak load current goes up. The circuit is then in the current-limiting mode along curve b. When the peak load current reaches I2, a value predetermined by the threshold Vth1, the peak detecting COMP1 is activated such that DTCC is quickly lowered from d2 to a very low value of d3, entering the over-current protection mode along curve c.

It is obvious from the above discussion that the threshold Vth1 is required to be higher than the threshold Vth2.

Figure 15:
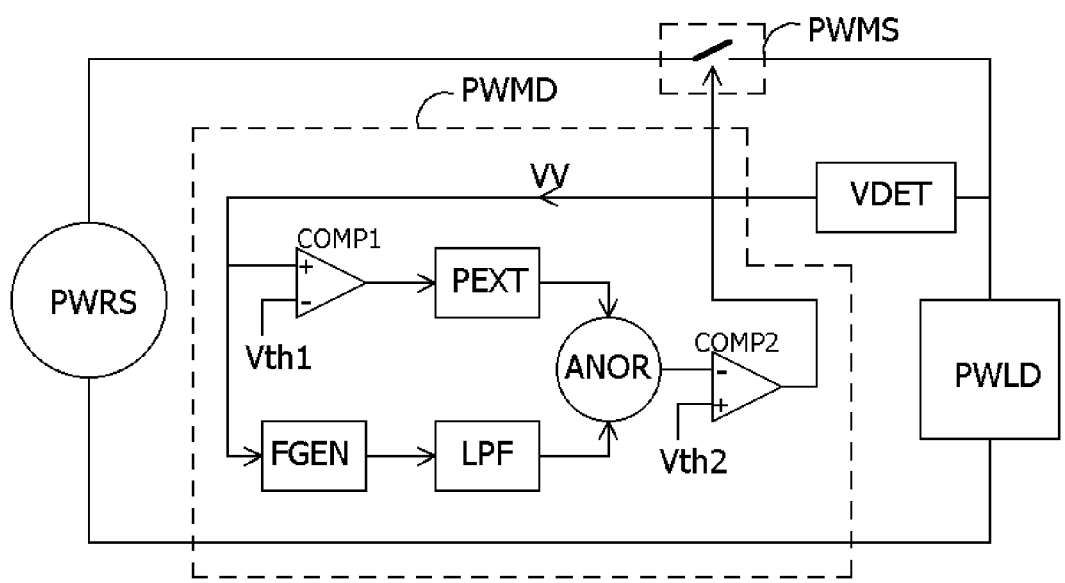

While the above circuit technique is applied to current control, the same principle is applicable to voltage control as in some embodiments of the present invention. This is illustrated by a circuit shown in FIG. 15, whereby the voltage across the load PWLD is detected by voltage detector VDET as a voltage signal VV. Apart from the difference in scaling (not shown) VV is applied in a similar way as VI in the circuit for current control as shown in FIG. 13A. Voltage control and over-voltage protection are achieved in a similar way as current control and over-current protection.

In yet some other embodiments of the present invention, the power of the load is measured as a signal to control the pulse-width-modulation driver PWMD. Power is then limited to a level predetermined by a threshold Vth2 and is over-current protected when the load power exceeds a value predetermined by a threshold Vth1.

The techniques for dynamic level shifting are now proposed herewith.

Level shifting is deployed in high voltage driving such that circuit network on the high side can be controlled by a control signal from the low side. A cost effective approach for signal transfer from low side to high side is through the use of a current link between the low and high side, the current being generated by a voltage controlled current generator on the low side. The current may be further converted from current to a voltage, by a current to voltage converter, for driving the circuit elements on the high-side.

While the following discussion is on level shifting in a common direction from low voltage side to high voltage side, the reverse, i.e. from high side to low side, is equally feasible.

For digital control signals, an alternative approach of level shifting is by signal coupling through a capacitor between the low and the high side. A latch on the high side is triggered to toggle in response to the digital control signal from the low side. An advantage of this approach is that power consumption only takes place in the short moments when the latch is triggered to change state. However the latch may be vulnerable to being mal-triggered in a noisy environment, such as when there are abrupt changes of high voltage taking place in the associated circuit network.

High voltage level shifting is often deployed to control a power switch by a digital control signal from the low voltage side. A simplified circuit diagram to show the arrangement is in FIG. 16. The shifting circuit is shown divided into two parts, the low voltage side LVS, and the high voltage side HVS respectively. The signal to be shifted, Sigin, is connected to the gate of transistor C11 which acts as a current source to deliver a current to the resistor load R1 on the high side. Similarly, an inverted signal of Sigin, output from the inverter gate GIN, is applied to drive a second transistor Q2 to deliver another current to a second resistor load R2. Two complementary signals Sigh1 and Sight are hence generated on the high side in synchronization with the signal Sigin on the low side. These two complementary signals are to drive an SR latch LATC to give Sigout as the output signal of the voltage level shifter.

Sigout is usually deployed to drive a power switch on the high side, not shown. Alternatively to reduce power consumption the latch can be triggered to change state by narrow pulses from the low side. This can be achieved by driving the level shifting transistors Q1 and Q2 by pulses derived from the input signal Sigin at its positive and negative edges respectively.

Figure 16:
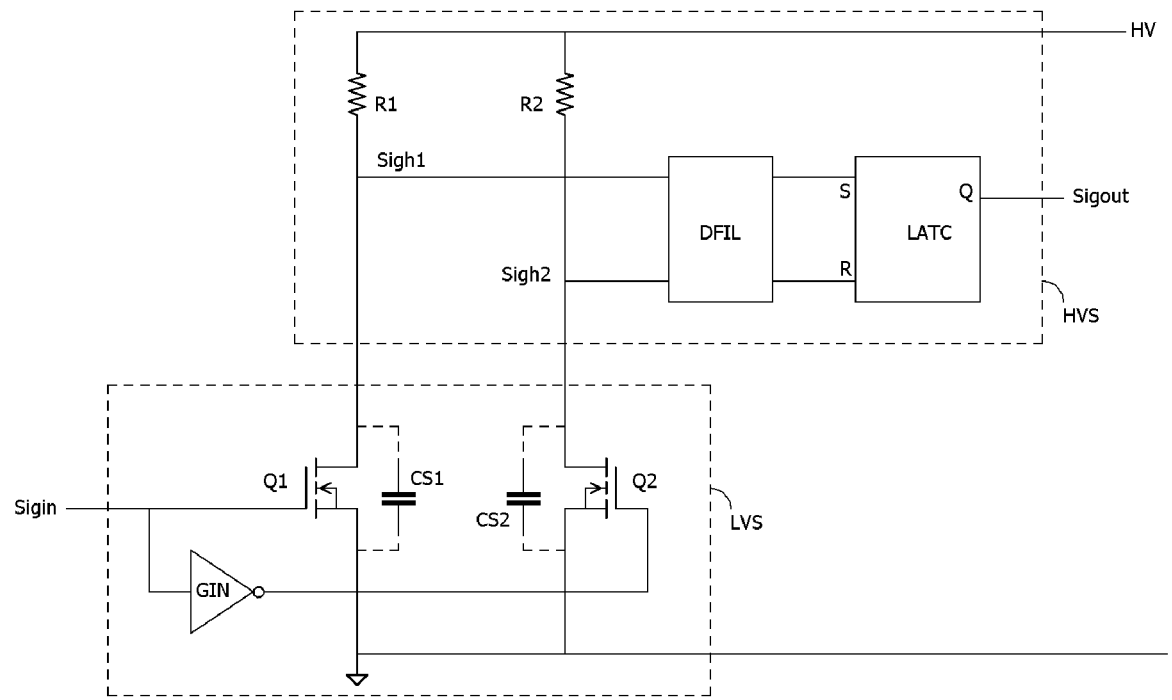

Shown in FIG. 16 a digital filter DFIL is placed before the SR latch LATC. This is a common practice in the prior art to have the digital filter to remove the common mode noise which could has been introduced into the circuit network.

When a high voltage is switched on and off, the abrupt change of voltage, with a very high voltage slew rate expressed as dV/dt will induce high common-mode noise current spikes due to the presence of parasitic capacitance, such as CS1 and CS2 shown in FIG. 16, in association with the switching devices Q1 and Q2. This will cause signal corruption when coupled to the control circuit which may be rendered inoperative. To tackle the problem, various schemes have been devised in the prior art, such as those disclosed by the U.S. Pat. No. 8,957,721 where differential comparator with high common mode rejection ratio is deployed, and the U.S. Pat. No. 7,495,482 where digital filters are deployed, to remove the noise induced by high voltage fluctuation.

However, high noise current spikes coupled into a semiconductor switching device such as a BJT or a MOSFET may overdrive the device to deep saturation so that it will take quite a long time subsequently to change state according to the control signal. Neither an analog nor a digital filter may be able to tackle the problem created by over-driving the switching device. Consequently switching speed is limited. It is therefore the goal of the present invention to eliminate the bad effects of the noise current spikes induced by high voltage excursion.

Figure 17:
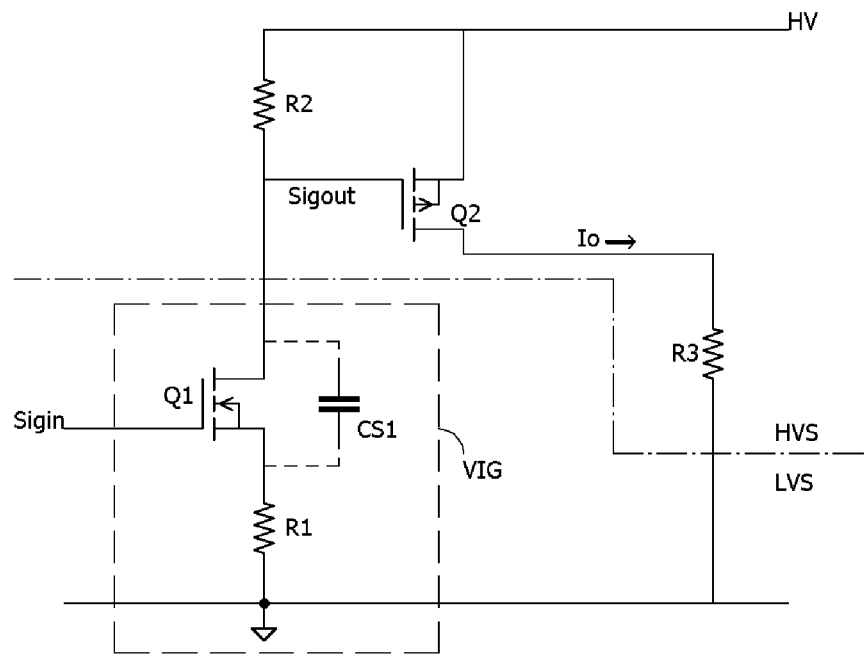

FIG. 17 is a simplified diagram of the basic circuit to be employed in the preferred embodiments of the present invention. Transistor Q1 and resistor R1 at the low voltage side form a current generator controllable by the input signal Sigin. The current from the drain electrode passes through resistor R2 at the high voltage side drops out a voltage signal Sigout which drives the transistor Q2, the source of which is connected together with the resistor R2 to a high voltage supply HV. In other words, by the voltage level shifter VLS, signal Sigin is shifted from low voltage side to high voltage side as Sigout. As an example of application, Sigout is coupled to drive a power switch formed by transistor Q2. Consequently, Sigin controls the high side switch to deliver a current Io through the load R3.

Shown in the circuit diagram of FIG. 17 is also a capacitor CS1 which is the parasitic capacitor of the Q1, between the source and the drain electrodes. Despite of a small capacitance value in general, this capacitor is under a high voltage HV from the high voltage side HVS. An abrupt change of the high voltage, due to whatever reason, may cause high current flow to charge or discharge the capacitor, giving rise to noise current spikes which interferes the operation of the current generator formed by Q1 and R1. Further, large current spikes through the resistor R2 means large voltage spikes which are coupled to the transistor Q2. Consequently, the transistor may be overdriven by the spikes to saturation. More details of the impact caused will follow.

Figure 18:
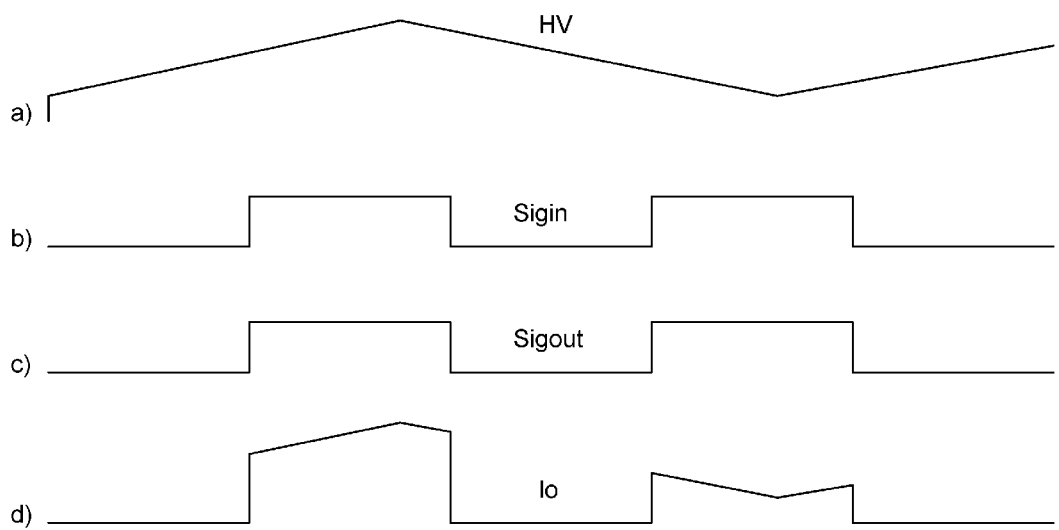

FIG. 18 shows the various waveforms involved in the operation. Curve a) is the high voltage supply HV, noise free but varying at a low frequency typical for a rectified mains supply. Curve b) is the input control signal Sigin, which is shifted truthfully to the high voltage side as Sigout, curve c). The output current Io, curve d) is seen chopped clean in accordance with the control signal Sigin.

Figure 19:
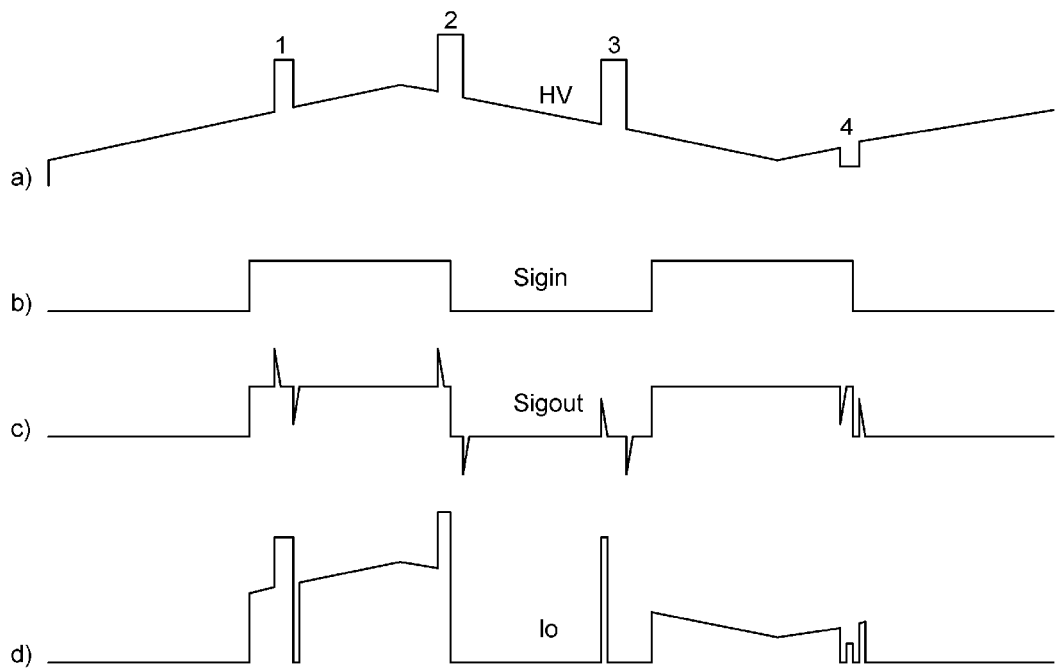
FIG. 19 Waveform with reference to FIG. 17, with noise current present

FIG. 19 shows the same case but with a noise problem incurred by the voltage spikes carried by the supply voltage. The parasitic capacitor CS1 and the resistor R2 connected in series as shown in FIG. 17 may be viewed as a differentiation circuit. Should there be any rapid variation in the supply voltage HV, the excursion of voltage is differentiated to give a large current through and hence a large voltage spike over the resistor R2. The spikes, in either polarity dependent on the polarity of dV/dt, will be added to signal Sigout which is hence corrupted as shown by curve c).

As shown in FIG. 19, curve a) of the voltage HV is seen carrying noise pulses marked 1 to 4, pulses 1 to 3 being positive pulses while pulse 4 being a negative pulse. Due to noise pulse 1, Sigout as curve c) is corrupted by two noise spikes corresponding to the positive and negative edges of the pulse. As Sigin is high at the moment, only negative spike has a real effect on Sigout which causes an erroneous drop in Io as shown in curve d). For pulse 2, the first positive spike is added to a high Vigout, while the negative spike is added to a low Sigout. Neither of the two has any effect on Io. For pulse 3, only the positive spike erroneously turns on Io at the moment Sigin is low, while the negative spike has no effect. For pulse 4 which is a negative pulse, the first spike which is negative turns Io off while it should be on, and the second spike which is positive turn Io on while it should be off if there is no such a noise pulse.

Conclusions to be drawn from the above observation: fast excursion of supply voltage induces noise voltage spikes on the level shifted signal, the effect of which depends on the polarity of excursion with respect to the state of the signal. The current pulses induced are often very large that the traditional filtering or compensation approach is not at all effective. An alternative way is required.

As one of the preferred embodiments of the present invention, a voltage level shifter is comprising a voltage-controlled current generator operated at a first voltage level and with an input line coupled to receive an input signal to be shifted; a current to voltage converter operated at a second voltage level and with an output signal coupled to an output line; wherein the current output from the current generator is coupled to the input of the voltage converter; and a bleeding means to bleed off noise current spikes induced by excursion of voltage between the first and the second voltage levels; whereby the output signal substantially duplicates the input signal without being interfered by the noise current spikes.

Figure 20:
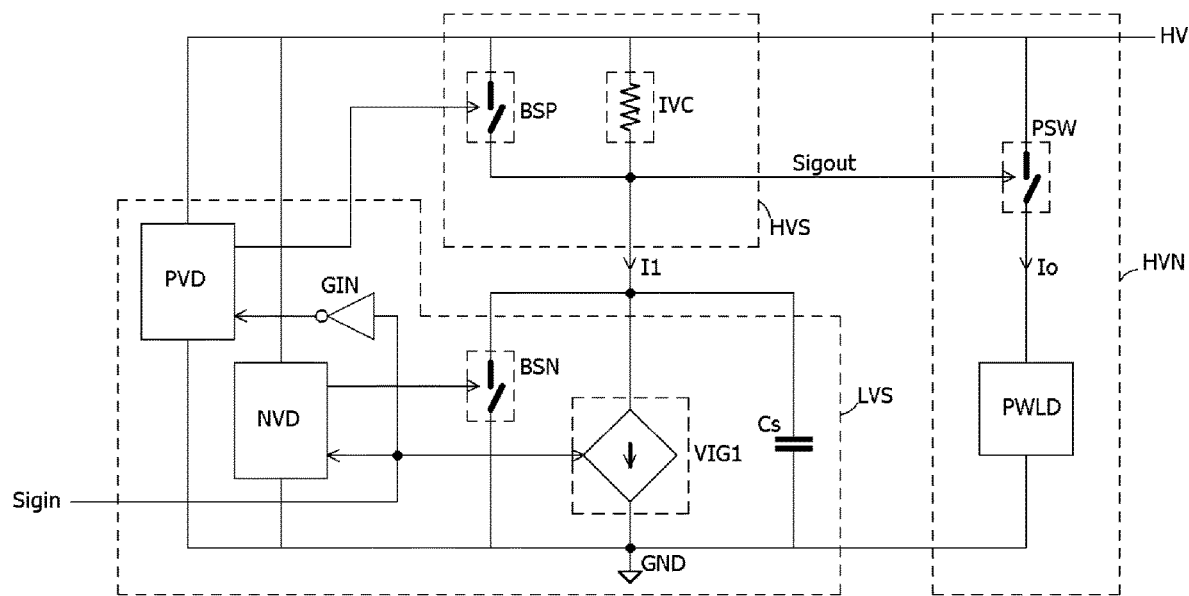
FIG. 20 Block diagram of voltage level shifter as an embodiment of the present invention FIG. 21 Flow chart illustrating the operation of the voltage level shifter of FIG. 20

The operation principle of a preferred embodiment of present invention is to be described with the aid of the block diagram of FIG. 20. There are three parts of the network shown, that of the low voltage side LVS and the high voltage side HVS together forming the voltage level shifter, while the high voltage network HVN is an example of application of the shifter. The signal labeled Sigin is the input signal while Sigout is the output signal of the level shifter.

As already explained with reference to the circuit diagram of FIG. 17, the basic elements of the level shifter is the voltage controlled current generator VIG under the control of the input signal Sigin at the low voltage level, and the current to voltage converter, IVC, which can simply be a resistor the voltage drop of which is the signal output Sigout at the high voltage level. The source of problem is mainly the parasitic capacitor Cs in parallel with the current generator VIG.

Two bleeding switches are employed to bleed off the positive and the negative noise current spikes, when the current generator is off and on respectively.

When the current generator is off, i.e. when Sigin is low, its inverted signal through an inverter gate GIN enables the positive voltage excursion detector PVD ready to detect the positive voltage excursion or +dV/dt of the high voltage supply HV. Once a positive excursion of a predetermined rate is detected, a pulse of sufficient width is generated to turn the positive bleeding switch BSP on thus shorting the voltage converter IVC during the pulse period, when induced current through the parasitic capacitor Cs is diverted from passing through the voltage converter. Sigout remains low without departing from the state of Sigin.

When the current generator is on, i.e. when Sigin is high enabling the negative voltage excursion detector NVD ready to detect the negative voltage excursion or −dV/dt of the high voltage supply HV. Once a negative excursion of a predetermined rate is detected, a pulse of sufficient width is generated to turn the negative bleeding switch BSN on thus shorting the current generator VIG during the pulse period, when charge in the parasitic capacitor Cs is rapidly discharged by the switch BSN instead of rushing through the voltage converter IVC as HV falls below the voltage over Cs. Sigout remains high without departing from the state of Sigin.

It is important to have the bleeding period sufficiently long to cover the induced noise current spikes. To assure this, the voltage excursion detector should be designed to give an output pulse of sufficient width so as to gate the bleeding on long enough. Further, the voltage excursion detectors are shown connected between the high voltage HV and the ground, and not between HV and any other voltage supply at the low voltage side, the latter of which is usually more regulated in practical circuits and any fluctuation would be of much low magnitude compared to that of the high voltage HV. Therefore, detecting the voltage excursion of the high voltage HV with reference to the ground is practically the same as detecting the excursion of the high voltage HV with reference to any other voltage on the low voltage side.

With the bleeding action described above, in response to the high voltage excursion between the two voltage levels, Sigout follows Sigin through the voltage level shifter, without being interfered by the noise current spikes induced by the voltage excursion.

Figure 21:
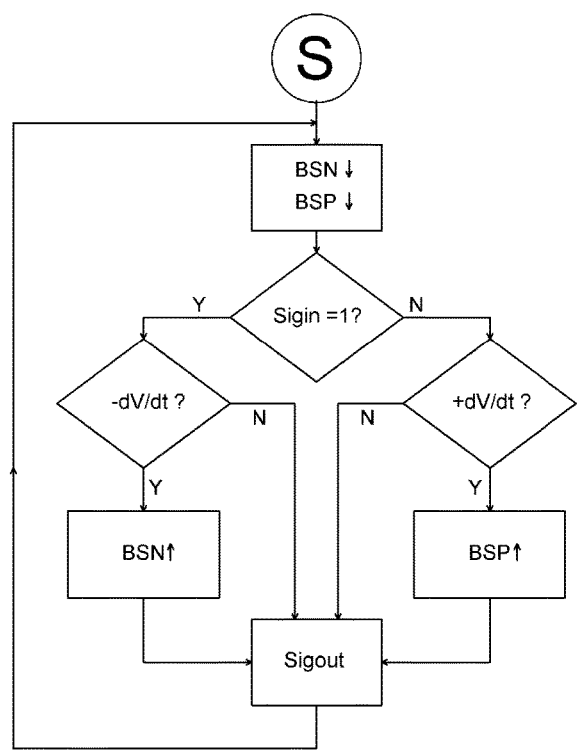

The operation sequence of the above level shifter can also be illustrated by a flowchart in FIG. 21. The circuit has the bleeding switches BSP and BSN turned off (indicated by down arrow) to start with, the input signal Sigin is tested for high or low. If Sigin is low, switch BSP is turned on (up arrow) once +dV/dt is detected. If Sigin is high, switch BSN is turned on once −dV/dt is detected. Sigout is output clear of corruption. BSP and BSN are turned off ready for next bleeding action as and when required.

Figure 22:
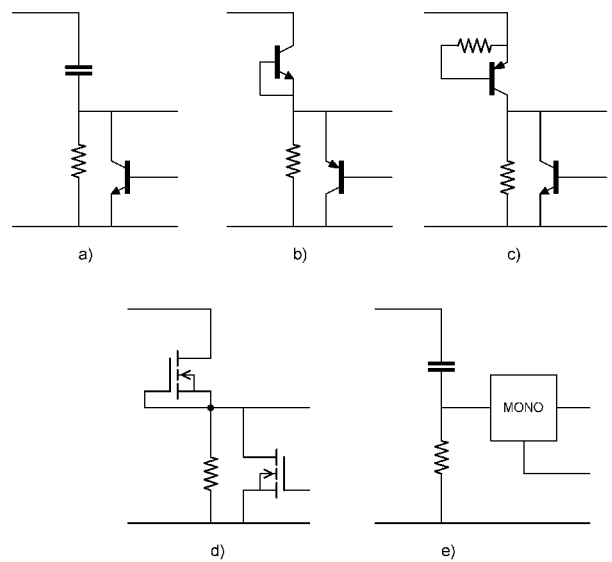
FIG. 22 Examples of voltage excursion detectors

For implementation, FIG. 22 shows possible voltage excursion detector circuits deployed in some of the embodiments of the present invention. Circuit a) is a CR differentiator output of which is controlled by an NPN transistor switch, circuit b) is also a CR differentiator, with the capacitor being the parasitic capacitor (not shown) of an NPN transistor. Its control is however by a PNP transistor requiring a reversed polarity of control signal compared to circuit a). Circuit c) uses a PNP transistor instead for the capacitance required. Circuit d) uses two MOSFETs, one for the capacitance and the other for control. It will be appreciated that for the aforementioned circuits a) to d), the output from the voltage excursion detector is a pulse shaped by, apart from the value of CR, the slew rate as well as the magnitude of the noise pulse at the input. The higher the slew rate, the larger is the magnitude of the output pulse. The larger is the magnitude of the noise pulse, the wider will be the width of the output pulse. Therefore, in order that the bleeding switch is driven to bleed long enough in a particular design situation, an independent timer can be designed in. Circuit e) may serve this purpose as shown, with a mono-stable multivibrator being triggered by the output of the differentiator. The output from this voltage excursion detector is therefore a pulse of predetermined width by design choice of the mono-stable multivibrator.

Figure 23:
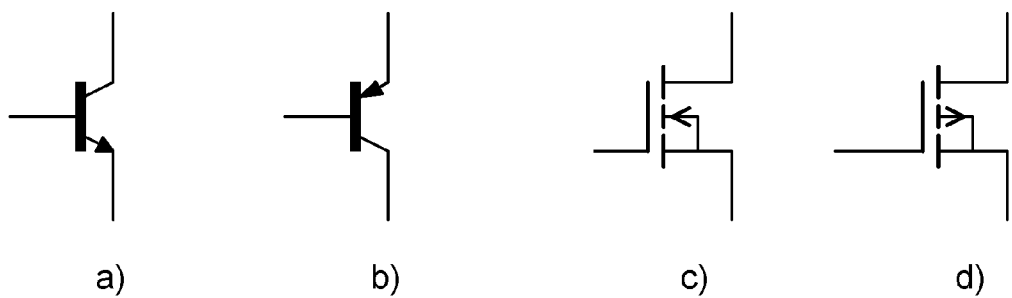
FIG. 23 Examples of bleeding switches

FIG. 23 shows practical switch devices for current bleeding. Device a) is an NPN transistor, device b) a PNP transistor, device c) an N-MOSFET while device d) a P-MOSFET.

In yet another one of the preferred embodiments of the present invention, a voltage level shifter is proposed for level shifting between two voltage levels, comprising: an input terminal to receive a signal one referenced to a low voltage level; an inverter converting the signal one to a signal two; a current source one and a current source two, both controllable by the signal one; a current source three controllable by the signal two; a switch one coupled between a high voltage level and the current source three, the switch one controllable by the current source one; a switch two coupled between the high voltage level and the current source two, the switch two controllable by the current source three; an output terminal coupled to receive from the current source two as an output current; whereby the output current is controlled by the signal one.

Figure 24:
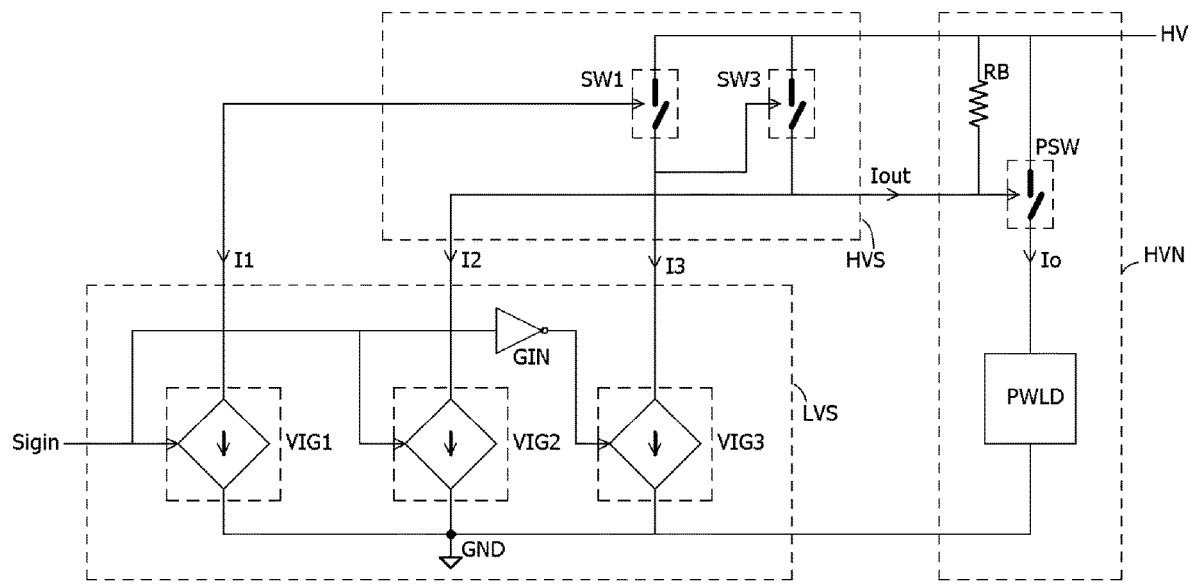
FIG. 24 Block diagram of another voltage level shifter as an embodiment of the present invention FIG. 25 Block diagram of another voltage level shifter as an embodiment of the present invention FIG. 26 Block diagram of another voltage level shifter as an embodiment of the present invention FIG. 27 Examples of voltage-controlled current generators FIG. 28 Examples of current-controlled bleeding switches FIG. 29 Block diagram of a power control system by direct drive as an embodiment of the present invention FIG. 30 Block diagram of a power control system by direct drive as an embodiment of the present invention FIG. 31 Block diagram of a power control system by direct drive as an embodiment of the present invention FIG. 32 Block diagram of a power control system by direct drive as an embodiment of the present invention

The operation principle of this preferred embodiment of present invention is to be described with the aid of the block diagram of FIG. 24. There are three circuit networks shown, that of the low voltage side LVS and the high voltage side HVS together forming the voltage level shifter, while the high voltage network HVN shows an example of application of the shifter. The signal Sigin is the input signal while Sigout is the output signal of the level shifter.

As already explained with reference to the circuit diagram of FIG. 17, the basic elements of the level shifter is the voltage-controlled current generator under the control of the input signal Sigin at the low voltage level, and the current from the current generator passes through a resistor at the high voltage side to drop out a voltage signal Sigout which is taken as the signal output of the level shifter at the high voltage level. However, if the level shifter is intended for a current-driven device, the output of the level shifter will need to be in the form of a current. Nevertheless, the problem due to the parasitic capacitor in parallel with the current generator VIG stays.

With reference to FIG. 24, level shifting is to be performed from a low voltage side LVS to a high voltage side HVS as shown, with respect to the ground GND and a high voltage supply HV respectively. For the convenience of explanation positive high voltage supply is assumed for HV, but this is not necessary in general as long as components of correct polarity types are deployed for the relevant circuit network.

The input of the level shifting circuit is Sigin, a bi-level digital signal, while the output is Iout, the waveform of which will be a replicate of that of Sigin but at a high voltage level of HV. As an example of application, Iout is applied to drive a current-driven power switch PSW, a PNP power BJT as shown in FIG. 24, turning on a power load PWLD and drawing a current Io from the high voltage supply HV.

As shown on the low voltage side LVS, the input signal Sigin is coupled to drive directly two current generators VIG1 and VIG2. Sigin is also inverted by the inverter gate GIN and coupled to drive a third current generator VIG3. For actual implementation of the current generators, refer to the examples shown in FIG. 27. In practice, since both VIG1 and VIG2 are to be driven by the same input signal Sigin, they can be combined into just one single current generator the output of which is divided subsequently by a suitable circuit arrangement into two currents, I1 and I2.

On the high voltage side HVS, the output terminal is connected to the output of the current generator VIG2. A switch SW3 is coupled between the high voltage level HV and the output terminal, which may be turned on to short-circuit the output to the high voltage level HV under the control of the current generator VIG3. However, current from VIG3 may be bypassed by a switch SW1, which is itself controlled by the current from VIG1. For actual implementation of the current-driven switches, refer to the examples shown in FIG. 28.

The operation of the level shifting circuit is now explained. As shown in FIG. 24, when Sigin is low, VIG1 and VIG2 are deactivated and therefore currents I1 and I2 are zero. Meanwhile VIG3 is activated and current I3 is turned on. Since I1 is zero, SW1 is open so that I3 is allowed to activate SW3 making SW3 closed to short-circuit the output to the high voltage level HV. The output current Iout is hence zero. Even with the presence of any noise pulses on HV, Iout remains zero because of the short-circuiting of SW3.

When the input Sigin turns high, VIG1 and VIG2 are activated and therefore currents I1 and I2 are turned on. Meanwhile VIG3 is deactivated and current I3 is turned zero. Since I1 is on, SW1 is closed so that I3 is prevented from activating SW3 making SW3 open-circuit. Current I2 now flows to the output as Iout.

When there are very abrupt changes in HV, induced noise pulses will be coupled to the output current Iout. These noise pulses will be of a pulse width determined by a time constant proportional to the product of the stray capacitance across VIG2 and the output resistance of the level shifter, which in this case the input resistance of the switch PSW, labeled RB in FIG. 24. If this resistance is sufficiently low which is true for a BJT as the power switch PSW, the time constant will be very low that the noise pulses will have a very narrow width.

Consequently the power switch PWS might not be responsive to such short pulses riding on the signal current Iout, making the level shifter immune to the dV/dt noise.

In yet another one of the preferred embodiments of the present invention, a voltage level shifter is proposed for level shifting between two voltage levels, comprising: two current sources from the low voltage level, controllable respectively by a signal one and a signal two in anti-phase; a voltage limiting device coupled between the first current source and a high voltage level; a capacitor with a terminal coupled to the common node of the first current source and the voltage limiting device via a rectifying device, with a second terminal coupled to the high voltage level; a bleeding means coupled in parallel to the capacitor, the bleeding means being controllable by the second current source; wherein the first current source is configured to charge the capacitor via the rectifying device, and the second current source is configured to drive the bleeding means to discharge the capacitor; whereby the voltage across the capacitor is controlled by the signal one.

In this case, the relatively large input capacitance of the gate of a power MOSFET will be taken advantage of for level shifting. In brief, the capacitor is to be charged and discharged rapidly in synchronous with the input control signal Sigin. Special arrangement is made that charging current is rectified, i.e. discharging along the charging path is prohibited, such that the output signal of the level shifter is shielded from corruption by the noise pulses riding on the high voltage supply HV.

Figure 25:
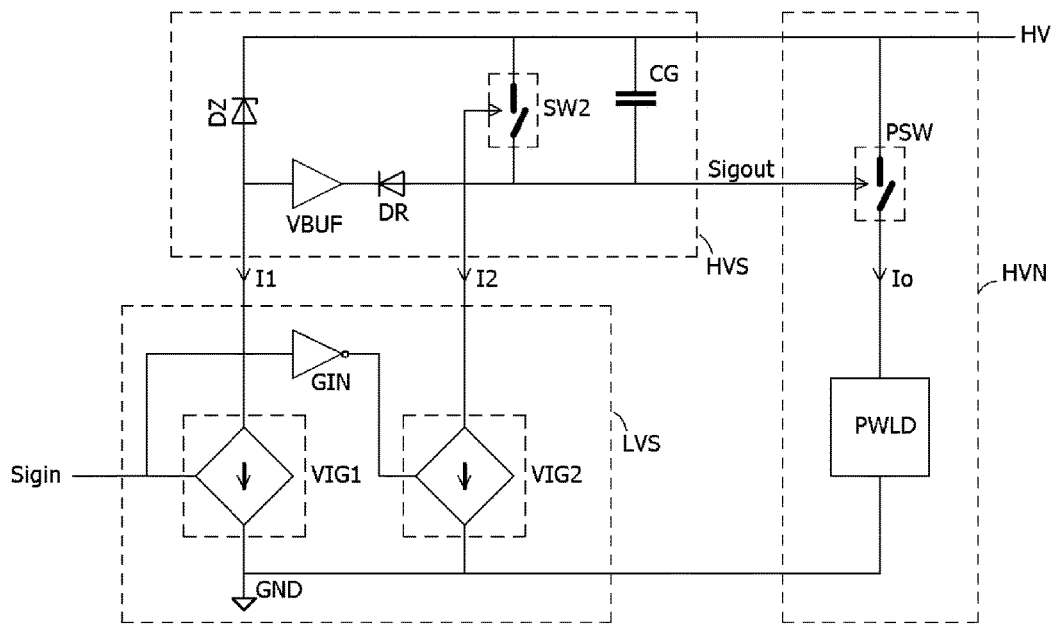

Referring to the block diagram of FIG. 25, a digital signal to be level shifted, Sigin, is applied to a first current generator VIG1, while the inverted signal by operation of an inverter gate GIN is applied to a second current generator VIG2. For actual implementation of the current generators, refer to the examples shown in FIG. 27.

When Sigin is high, current I1 is generated by VIG1 and is passed to a voltage limiting device DZ, which is as shown in this case a Zener diode DZ of a predetermined nominal voltage rating. A voltage equal to the rating is thus established across the Zener diode. At the same time, current I2 from VIG2 is zero as a low signal, inverted Sigin, is applied to the control input of VIG2. With I2 equal to zero, a bleeding switch SW2 in parallel with a capacitor CG is disabled, i.e. open-circuit. Through a rectified charger, formed by say a voltage buffer VBUF and a rectifier diode DR cascaded in series as shown, the capacitor is charged up quickly to a value equal to the voltage across the Zener diode DZ minus the voltage drop on diode DR. The charged up state is maintained as long as the input Sigin stays high.

When Sigin goes low, I1 drops to zero and voltage across the Zener diode DZ drops too, making the rectifier diode DR reversed biased. On the other hand, VIG2 is enabled to generate a current I2 which turns on the switch SW2 and shorts the capacitor CG, discharging the capacitor quickly to zero voltage.

Therefore the voltage across the capacitor CG, i.e. the output of the level shifter Sigout with respect to the high voltage supply HV, is controlled by Sigin in synchronization. Shown in FIG. 25, as an example of application, Sigout may be coupled to drive a voltage-driven power switch PSW, such as a P-channel MOSFET, switching on a power load PWLD and drawing a current Io from the high voltage supply HV.

When Sigin is high and current I1 is on, the capacitor CG is charged to a voltage limited by the diode DZ. If then there are abrupt changes in HV, noise current pulses will be induced by the presence of stray capacitance (not shown) in parallel with VIG1. By the direction of change of the voltage HV, current pulses might be added to or subtracted from the current I1. By the property of the Zener diode, the increase of current will not raise much the voltage across the diode DZ. On the other hand, the decrease of current to a sufficiently low value or even to a negative value will bring the voltage across DZ below the nominal Zener voltage. However, the rectified charger prevents the discharge of the capacitor CG through the charging path, and therefore the voltage across the capacitor CG is not at all affected. Sigout stays high.

When Sigin is low and current I1 is off, the capacitor CG is discharged by switch SW3 to zero voltage. If then there are abrupt changes in HV, noise current pulses will be induced by the presence of stray capacitance in parallel with VIG1. However since SW3 is closed, any possible induced current flowing through the diode DR will be bypassed by SW3 without charging the capacitor CG. Sigout stays low.

Figure 26:
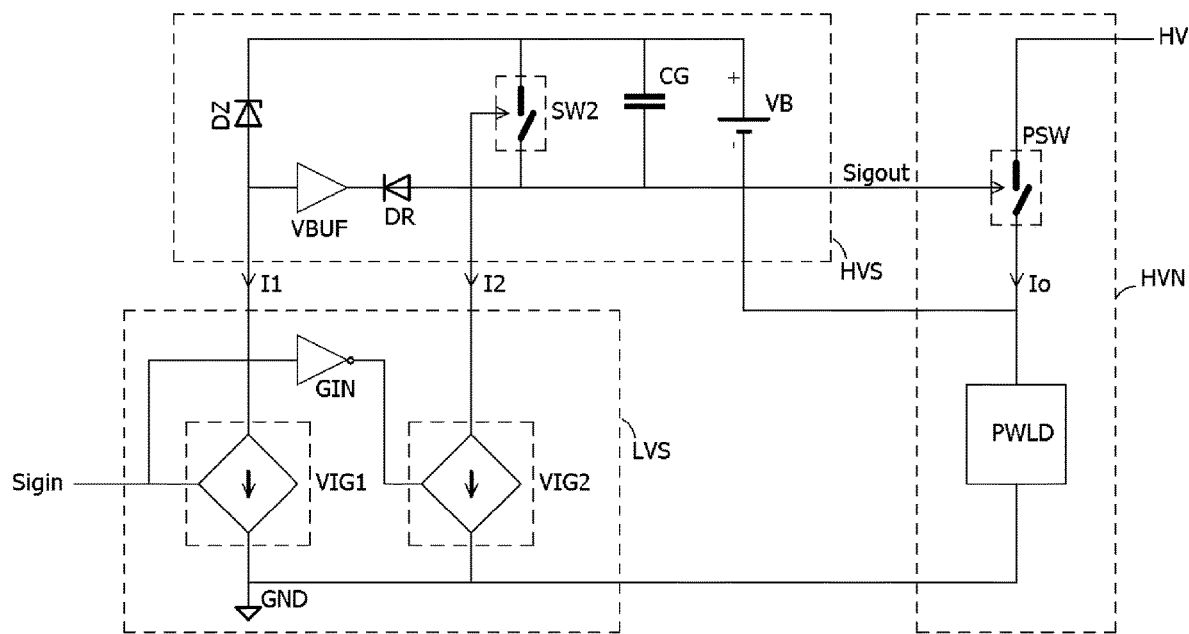

The exemplary circuit as shown in FIG. 25 may be deployed for driving a P-channel MOSFET. For N-channel MOSFET, a gate signal of reversed polarity is required and may be provided by a modified circuit as shown in FIG. 26. As shown, a floating bias voltage VB is connected to the low side of the switch PSW, which is the source electrode of the N-channel MOSFET. VB is chosen to have a voltage close to the Zener voltage of DZ. The gate signal is therefore equal to the voltage of VB minus the voltage across the capacitor CG. As the voltage across CG is switched between zero and the Zener voltage of DZ, the gate voltage is switched between VB and zero.

Figure 27:
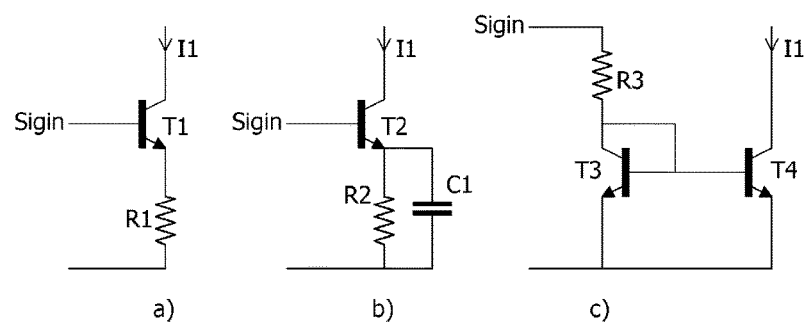

For practical implementation of the level shifting circuits, some examples are shown in FIG. 27 for voltage-controlled current generators. In each of the circuit diagrams a), b) and c), the current I1 generated is roughly proportional to the voltage of control signal Sigin (minus the base-emitter voltage) divided by the value of the resistor R1, R2 or R3 as shown. In particular, in circuit b), the capacitor C1 helps to boost the output current at the rising edge of the current, thus speeding up the rising and falling transitions of the level shifter output Sigout or Iout.

Figure 28:
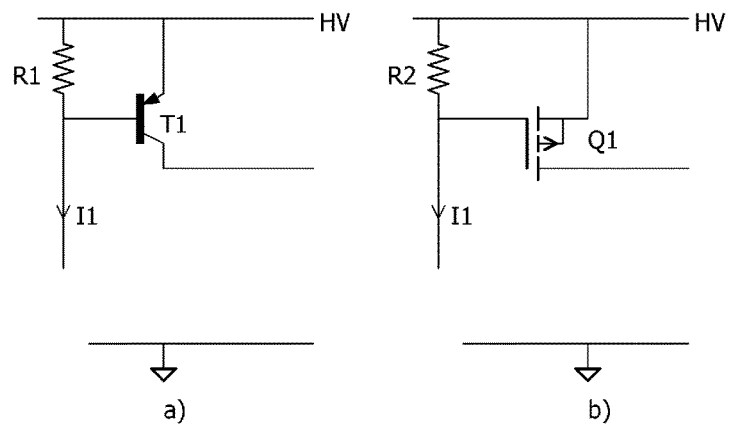

Circuit examples of current-controlled switches are shown in FIG. 28. In circuit a), input current I1 turns on the transistor T1 which acts as a switch. Similarly, in circuit b), a MOSFET is used instead as a switch. The gate voltage required to drive the MOSFET is obtained by voltage-drop on the resistor R2 by current I1.

With the implementation of the key components discussed, we may now examine some of the exemplary embodiments of the present invention for power control by direct drive.

Figure 29:
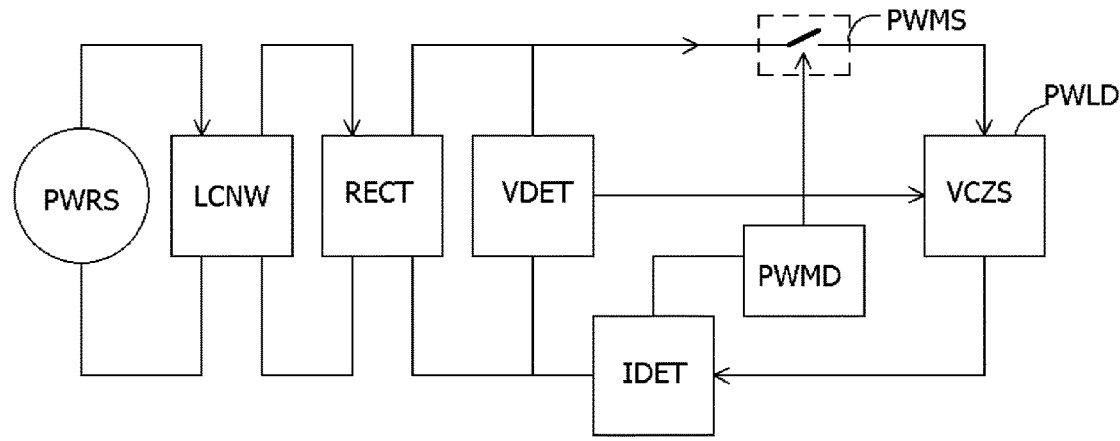

FIG. 29 is a block diagram of a power control system as an embodiment of the present invention, showing the key components therein:

A power supply PWRS as a source of electrical energy featuring generally by its electromotive force, internal impedance, waveform and frequency;

For a general discussion, the power supply is not limited to AC or DC. The power control system is in principle capable of handling both AC and DC supplies. However, when a rectifying component is present, it is assumed that the supply is in AC and that direct current, be it filtered or not, is required for proper functioning of the load. Further when resonance network is deployed, it should be assumed that the power supply is in AC and that a fixed dominant frequency is present. Furthermore, unless otherwise stated, the power supply is a voltage source of negligible internal impedance. However, if it is a current source, its internal impedance may be assumed infinitely large for ease of discussion.

A reactive (inductance-capacitance or LC) network LCNW to provide power factor correction, power limiting and/or EMI filtering. It is worth mentioning here that by making an LC network to resonate at the supply frequency, a high impedance power source is formed and which will be employed for direct drive in some of the embodiments of the present invention;

A rectifying means RECT to convert an AC supply voltage to a DC voltage for ease of control by general power electronics devices;

A load PWLD with its impedance (or admittance) synthesized by a voltage controlled impedance synthesizer VCZS, coupled to the rectifying means through a PWM (pulse-width-modulation) switch PWMS; in some of the embodiments of the present invention, as shown in FIG. 29, the impedance of the load PWLD is under the control of the supply voltage as rectified by RECT.

A pulse-width-modulation driver PWMD responsive to the output of a current detector IDET, which represents the current through the load PWLD;

Under the control of the voltage detector VDET, the impedance of the load PWLD may be controlled according to the power supply voltage. In some of the embodiments of the present invention, the impedance is controlled proportional to the instantaneous value of the supply voltage, resulting in a constant current through the load irrespective of the magnitude of the supply voltage. In some other embodiments of the present invention, the impedance is controlled proportional to the square of the instantaneous value of the supply voltage, resulting in a constant power on the load irrespective of the magnitude of the supply voltage.

Under the control of the driver PWMD, the duty cycle of the PWM switch PWMS may be modulated to control the current through the load PWLD. In some of the embodiments of the present invention, and through the design of the driver PWMD, the current may be controlled constant over a predetermined range, and may also be cut off for protection when a predetermined threshold is exceeded.

Note that to the power supply, the load PWLD may be viewed as a single element with an impedance of variable value $Z_{VCZS}$ under the control by the voltage controlled impedance synthesizer VCZS. Further, the impedance is further modulated by the PWM switch PWMS. Let the duty cycle of the PWM switch be DTCC, and ignoring the impedances of the reactive network LCNW and the rectifying means RECT, the impedance of the load as seen from the power supply side is $Z_{VCZS}$/DTCC.

Figure 30:
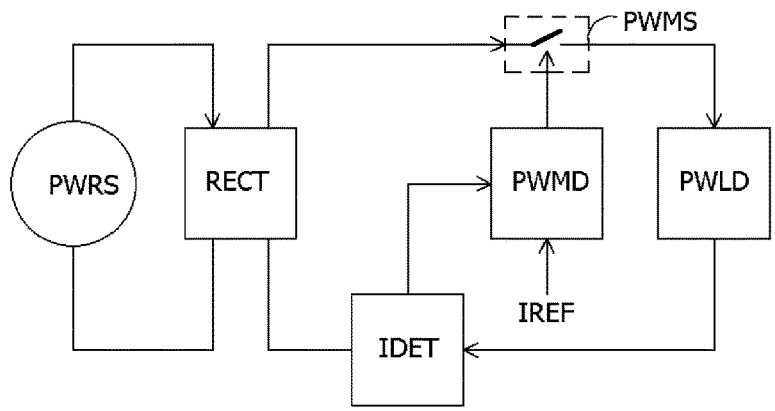

FIG. 30 shows the operation principle of an exemplary embodiment of the present invention whereby the load is driven by a constant current irrespective of the change of the power supply voltage. As shown by the block diagram, the load current is detected by IDET, output of which is coupled to the PWM driver PWMD with reference to a predetermined reference IREF. By controlling the duty cycle of the on time of the switch PWMS, the load current is controlled to be equal to IREF, independent of the power supply voltage.

Figure 31:
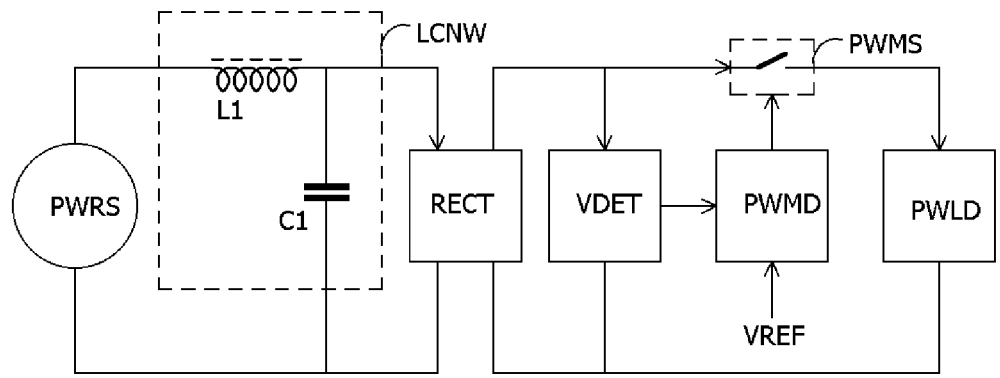

FIG. 31 shows the operation principle of another exemplary embodiment of the present invention with a power load PWLD being driven by a power supply current. The reactive network LCNW essentially consists of at least one capacitor and one inductor connected to resonate at the power supply frequency. At resonance, this reactance network presents a very high impedance (theoretically infinite for lossless resonating capacitor C1 and lossless resonating inductor L1) to the rectifier RECT and hence the load PWLD. Therefore the power supply PWRS together with the reactive network may be viewed as a current source supplying a current to the load PWLD with an effective impedance at the input of the rectifier. However, by the phase-cut action of the PWM switch PWMS as controlled by the driver PWMD, the voltage across the output of the rectifier is forced to follow a fixed voltage reference VREF. Consequently, by choice of the reference VREF, the load PWLD may be operated at a voltage lower or higher than the supply voltage. In effect, the reactive network is loaded by "constant voltage load", i.e. one with a "Zener diode" characteristics, by which a constant voltage device is driven by a constant current. Hence by a constant current from the reactive network, and a fixed voltage at the input of the rectifier, power delivered to the load PWLD through the rectifier is kept constant irrespective of the impedance characteristic of the load PWLD.

Figure 32:
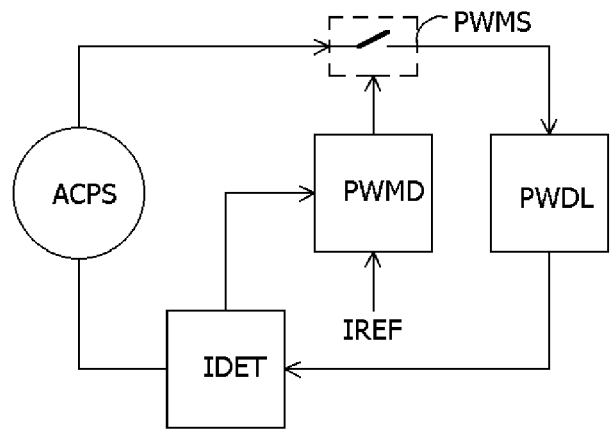

It has been mentioned that the employment of a rectifier RECT to convert an AC supply voltage to a DC voltage is for ease of control by general power electronic devices, as majority of these devices are made to operate under unipolar voltage. However, for high power operation, the rectifier dissipates considerable energy due to its ohmic drop. Therefore for some embodiments of the present invention, AC current is controlled directly without rectification of the AC voltage from the AC power supply ACPS. The PWM switch PWMS is required to be capable of AC operation. Analogous to the circuit performing constant current function as shown in FIG. 30, an AC version is shown in FIG. 32. The AC switch PWMS may be implemented by a pair of anti-series connected MOSFETs. The load PWLD, however, will also be required to operate under AC voltage.

Although the invention and its advantages have been described in detail, it should be understood that various changes, substitutions, and alterations can be made therein without departing from the spirit and scope of the invention as described. For example, the specific transistor implementation of the inventive circuits may be varied from the examples provided herein while still within the scope of the present invention. As some more examples, specified directions of current flow, polarities of the voltages may be reversed, the source and drain of a MOS transistor or the emitter and collector of a BJT, may be interchanged. By the duality property of electrical circuits, the roles of current and voltage, impedance and admittance, inductance and capacitance, etc., can be interchanged. In essence, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the invention.

The invention claimed is:

1. A circuit adapted to perform an arithmetic operation, wherein the arithmetic operation is one of multiplication, division, square root and square, comprising:
   a three-terminal circuit element with a drive terminal, a control terminal, and a common terminal, wherein:
   the circuit element has a characteristic parameter selectable from either a characteristic impedance or a characteristic admittance between the drive and the common terminals,
   the selected characteristic impedance or admittance being made proportional to a variable control signal, the control signal being applied at the control terminal;

the circuit element is coupled to receive a variable drive signal between the drive and the common terminals, the drive signal being selectable from either a variable voltage source or a variable current source, leading to a complementary current or voltage response of the circuit element;

a measuring means to determine the current or voltage response of the circuit element to the selected drive signal, wherein the current or voltage response is a result of an arithmetic operation on the control signal and the drive signal, the arithmetic operation being predefined according to a selection between the characteristic impedance or admittance of the circuit element, and a selection between a variable voltage source or a variable current source of the drive signal.

2. The circuit of claim 1, wherein:
a current source is selected to provide the drive signal;
a characteristic impedance is selected for the circuit element;
whereby a voltage response of the circuit element is measured proportional to a product of the drive and the control signals.

3. The circuit of claim 1, wherein:
a voltage source is selected to provide the drive signal;
a characteristic admittance is selected for the circuit element;
whereby a current response of the circuit element is measured proportional to a product of the drive and the control signals.

4. The circuit of claim 1, wherein:
a current source is selected to provide the drive signal;
a characteristic admittance is selected for the circuit element;
whereby a voltage response of the circuit element is measured proportional to a quotient of the drive signal over the control signal.

5. The circuit of claim 1, wherein:
a voltage source is selected to provide the drive signal;
a characteristic impedance is selected for the circuit element;
whereby a current response of the circuit element is measured proportional to a quotient of the drive signal over the control signal.

6. The circuit of claim 1, wherein:
a voltage source is selected to provide the drive signal;
the control signal is the current response of the circuit element to the drive signal;
a characteristic impedance is selected for the circuit element;
whereby a current response of the circuit element is measured proportional to a square root of the drive signal.

7. The circuit of claim 1, wherein:
a current source is selected to provide the drive signal;
the control signal is the voltage response of the circuit element to the drive signal;
a characteristic admittance is selected for the circuit element;
whereby a voltage response of the circuit element is measured proportional to a square root of the drive signal.

8. The circuit of claim 1, wherein:
a voltage source is selected to provide the drive signal;
the control signal is the drive signal;
a characteristic admittance is selected for the circuit element;
whereby a current response of the circuit element is measured proportional to the square of the drive signal.

9. The circuit of claim 1, wherein:
a current source is selected to provide the drive signal;
the control signal is the drive signal;
a characteristic impedance is selected for the circuit element;
whereby a voltage response of the circuit element is measured proportional to the square of the drive signal.

10. The circuit of any one of claims 1 to 9, wherein the circuit element comprises an analog-to-digital converter with an input and an output, said input being coupled to receive the control signal and said output being coupled to drive a plurality of controllable switches of a digital impedance or admittance synthesizer, wherein the synthesized impedance or admittance is that of the circuit element.

11. The circuit of claim 10, wherein the circuit element further comprises a function generator coupled to preprocess the control signal with a predetermined function prior input to the analog-to-digital converter.

12. A method of arithmetic operation, wherein the arithmetic operation is one of multiplication, division, square root and square, comprising the steps of:
constructing a three-terminal circuit element with a drive terminal, a control terminal, and a common terminal, wherein the circuit element has a characteristic parameter selectable from either a characteristic impedance or a characteristic admittance between the drive and the common terminals, the selected characteristic impedance or admittance being made proportional to a variable control signal;
coupling a variable drive signal to the circuit element between the drive and the common terminals, the drive signal being selectable from either a variable voltage source or a variable current source, leading to a complementary current or voltage response of the circuit element;
coupling the control signal to the control terminal;
determining the current or voltage response of the circuit element to the selected drive signal, wherein the current or voltage response is a result of an arithmetic operation on the control signal and the drive signal, the arithmetic operation being predefined according to a selection between the characteristic impedance or admittance of the circuit element, and a selection between a variable voltage source or a variable current source of the drive signal.

13. The method of claim 12, wherein:
a current source is selected to provide the drive signal;
a characteristic impedance is selected for the circuit element;
whereby a voltage response of the circuit element is measured proportional to a product of the drive and the control signals.

14. The method of claim 12, wherein:
a voltage source is selected to provide the drive signal;
a characteristic admittance is selected for the circuit element;
whereby a current response of the circuit element is measured proportional to a product of the drive and the control signals.

15. The method of claim 12, wherein:
a current source is selected to provide the drive signal;
a characteristic admittance is selected for the circuit element;

whereby a voltage response of the circuit element is measured proportional to a quotient of the drive signal over the control signal.

16. The method of claim 12, wherein:
a voltage source is selected to provide the drive signal;
a characteristic impedance is selected for the circuit element;
whereby a current response of the circuit element is measured proportional to a quotient of the drive signal over the control signal.

17. The method of claim 12, wherein:
a voltage source is selected to provide the drive signal;
the control signal is the current response of the circuit element to the drive signal;
a characteristic impedance is selected for the circuit element;
whereby a current response of the circuit element is measured proportional to a square root of the drive signal.

18. The method of claim 12, wherein:
a current source is selected to provide the drive signal;
the control signal is the voltage response of the circuit element to the drive signal;
a characteristic admittance is selected for the circuit element;
whereby a voltage response of the circuit element is measured proportional to a square root of the drive signal.

19. The method of claim 12, wherein:
a voltage source is selected to provide the drive signal;
the control signal is the drive signal;
a characteristic admittance is selected for the circuit element;
whereby a current response of the circuit element is measured proportional to the square of the drive signal.

20. The method of claim 12, wherein:
a current source is selected to provide the drive signal;
the control signal is the drive signal;
a characteristic impedance is selected for the circuit element;
whereby a voltage response of the circuit element is measured proportional to the square of the drive signal.

21. The method of any one of claims 12 to 20, wherein the circuit element comprises an analog-to-digital converter with an input and an output, said input being coupled to receive the control signal and said output being coupled to drive a plurality of controllable switches of a digital impedance or admittance synthesizer, wherein the synthesized impedance or admittance is that of the circuit element.

22. The method of claim 21, wherein the circuit element further comprises a function generator coupled to preprocess the control signal with a predetermined function prior input to the analog-to-digital converter.

23. A power control circuit, comprising:
a power supply
a load coupled to the power supply, wherein the impedance of the load is controllable by an analog signal;
a circuit of arithmetic operation of claim 8 or 9, wherein the drive signal is a voltage across the load, and the measured response of the circuit element is the analog signal;
whereby the power transferred to the load is controlled constant.

24. A method of power control, comprising the steps of:
coupling a load to a power supply, wherein the impedance of the load is controllable by an analog signal;
by the method of arithmetic operation of claim 19 or 20, converting a voltage across the load as the drive signal to the measured response of the circuit element as the analog signal;
whereby the power transferred to the load is controlled constant.

* * * * *